United States Patent [19]
Dickens et al.

[11] Patent Number: 5,825,598
[45] Date of Patent: Oct. 20, 1998

[54] ARCING FAULT DETECTION SYSTEM INSTALLED IN A PANELBOARD

[75] Inventors: James W. Dickens, Lexington, Ky.; Stanley J. Brooks, Rockvale, Tenn.

[73] Assignee: Square D Company, Palatine, Ill.

[21] Appl. No.: 799,095

[22] Filed: Feb. 11, 1997

[51] Int. Cl.$^6$ .................................................. H02H 3/00
[52] U.S. Cl. ................................ 361/42; 361/79; 361/63; 361/656
[58] Field of Search ........................... 361/42–46, 48–79, 361/86–87, 93, 111, 113, 94, 99–101, 641, 652, 653, 656, 62–63

[56] References Cited

U.S. PATENT DOCUMENTS

| | | | |
|---|---|---|---|
| H536 | 10/1988 | Strickland et al. | 324/456 |
| Re. 30,678 | 7/1981 | Van Zeeland et al. | 361/44 |
| 2,808,566 | 10/1957 | Douma | 324/127 |
| 2,832,642 | 4/1958 | Lennox | 299/132 |
| 3,471,784 | 10/1969 | Arndt et al. | 324/126 |
| 3,538,241 | 11/1970 | Rein | 174/143 |
| 3,588,611 | 6/1971 | Lambden et al. | 317/31 |
| 3,600,502 | 8/1971 | Wagenaar et al. | 174/143 |
| 3,622,872 | 11/1971 | Boaz et al. | 324/52 |
| 3,684,955 | 8/1972 | Adams | 324/72 |
| 3,746,930 | 7/1973 | Van Best et al. | 317/31 |
| 3,775,675 | 11/1973 | Freeze et al. | 324/51 |

(List continued on next page.)

FOREIGN PATENT DOCUMENTS

| | | |
|---|---|---|
| 0 094 871 A1 | 5/1983 | European Pat. Off. . |
| 0 615 327 | 9/1994 | European Pat. Off. ......... H02H 1/00 |
| 0 649 207 A1 | 4/1995 | European Pat. Off. . |
| 0 748 021 A1 | 12/1996 | European Pat. Off. . |
| 0 762 591 A2 | 3/1997 | European Pat. Off. . |
| 0 802 602 A2 | 10/1997 | European Pat. Off. . |
| 2 177 561 | 6/1985 | United Kingdom . |
| 2285886 | 7/1995 | United Kingdom . |
| WO 97/30501 | 8/1997 | WIPO . |

OTHER PUBLICATIONS

Antonio N. Paolantonio, P.E., Directional Couplers, R.F. Design, Sep./Oct. 1979, pp. 40–49.

Alejandro Duenas, J., Directional Coupler Design Graphs For Parallel Coupled Lines and Interdigitated 3 dB Couplers, RF Design, Feb., 1986, pp. 62–64.

Jean–Francois Joubert, Feasibility of Main Service Ground–Fault Protection On The Electrical Service To Dwelling Units, Consultants Electro–Protection Ins., 1980, Michelin St., Laval, Quebec H7L 9Z7. Oct. 26, 1990, pp. 1–77.

R.D. Russell, Detection Of Arcing Faults On Distribution Feeders, Texas A & M Research Foundation, Box H. College Station, Texas 77843, Final Report Dec., 1982, pp. 1–B18.

*Primary Examiner*—Jeffrey A. Gaffin
*Assistant Examiner*—Michael J. Sherry
*Attorney, Agent, or Firm*—Kareem M. Irfan; Larry I. Golden

[57] ABSTRACT

An integrated protection system for an electrical distribution system including a panelboard for receiving power from a utility source and distributing the power to a plurality of branch circuits each having line and neutral conductors for delivering the power to a load. The integrated protection system comprises a plurality of arcing fault detectors and line interrupters attached to positions in the panelboard. The arcing fault detectors detect the occurrence of an arcing fault in either of the branch circuits, while the line interrupters disconnect the load from the power source in response to the detection of an arcing fault in either of the branch circuits. The line interrupters and arcing fault detectors may comprise separate modules, each being connected to one of the positions in panelboard or being attached externally to the other module. Alternatively, the line interrupters and arcing fault detectors may be combined within individual modules, each individual module being connected to a position in the panelboard. An isolation module may be attached to one of the positions in the panelboard for electrically isolating arcing fault signals to the branch circuit on which they occur.

25 Claims, 18 Drawing Sheets

U.S. PATENT DOCUMENTS

| | | | |
|---|---|---|---|
| 3,858,130 | 12/1974 | Misencik | 335/18 |
| 3,869,665 | 3/1975 | Kenmochi et al. | 324/72 |
| 3,878,460 | 4/1975 | Nimmersjo | 324/52 |
| 3,911,323 | 10/1975 | Wilson et al. | 317/18 |
| 3,914,667 | 10/1975 | Waldron | 317/36 |
| 3,939,410 | 2/1976 | Bitsch et al. | 324/72 |
| 4,074,193 | 2/1978 | Kohler | 324/126 |
| 4,081,852 | 3/1978 | Coley et al. | 361/45 |
| 4,087,744 | 5/1978 | Olsen | 324/51 |
| 4,156,846 | 5/1979 | Harrold et al. | 324/158 |
| 4,169,260 | 9/1979 | Bayer | 340/562 |
| 4,214,210 | 7/1980 | O'Shea | 455/282 |
| 4,245,187 | 1/1981 | Wagner et al. | 324/54 |
| 4,251,846 | 2/1981 | Pearson et al. | 361/30 |
| 4,264,856 | 4/1981 | Frierdich et al. | 322/25 |
| 4,316,187 | 2/1982 | Spencer | 340/664 |
| 4,354,154 | 10/1982 | Schiemann | 324/126 |
| 4,387,336 | 6/1983 | Joy et al. | 324/51 |
| 4,459,576 | 7/1984 | Fox et al. | 336/84 |
| 4,466,071 | 8/1984 | Russell, Jr. | 364/492 |
| 4,639,817 | 1/1987 | Cooper et al. | 361/62 |
| 4,642,733 | 2/1987 | Schacht | 361/118 |
| 4,644,439 | 2/1987 | Taarning | 361/87 |
| 4,652,867 | 3/1987 | Masot | 340/638 |
| 4,658,322 | 4/1987 | Rivera | 361/37 |
| 4,697,218 | 9/1987 | Nicolas | 633/882 |
| 4,707,759 | 11/1987 | Bodkin | 831/642 |
| 4,771,355 | 9/1988 | Emery et al. | 361/33 |
| 4,810,954 | 3/1989 | Fam | 324/142 |
| 4,845,580 | 7/1989 | Kitchens | 316/91 |
| 4,853,818 | 8/1989 | Emery et al. | 361/33 |
| 4,858,054 | 8/1989 | Franklin | 361/57 |
| 4,866,560 | 9/1989 | Allina | 361/104 |
| 4,882,682 | 11/1989 | Takasuka et al. | 364/507 |
| 4,893,102 | 1/1990 | Bauer | 335/132 |
| 4,901,183 | 2/1990 | Lee | 361/56 |
| 4,922,368 | 5/1990 | Johns | 361/62 |
| 4,931,894 | 6/1990 | Legatti | 361/45 |
| 4,939,495 | 7/1990 | Peterson et al. | 337/79 |
| 4,949,214 | 8/1990 | Spencer | 361/95 |
| 4,969,063 | 11/1990 | Scott et al. | 361/93 |
| 5,010,438 | 4/1991 | Brady | 361/56 |
| 5,047,724 | 9/1991 | Boksiner et al. | 324/520 |
| 5,051,731 | 9/1991 | Guim et al. | 340/638 |
| 5,121,282 | 6/1992 | White | 361/42 |
| 5,166,861 | 11/1992 | Krom | 361/379 |
| 5,168,261 | 12/1992 | Weeks | 340/515 |
| 5,179,491 | 1/1993 | Runyan | 361/45 |
| 5,185,684 | 2/1993 | Beihoff et al. | 361/45 |
| 5,185,685 | 2/1993 | Tennies et al. | 361/45 |
| 5,185,686 | 2/1993 | Hansen et al. | 361/45 |
| 5,185,687 | 2/1993 | Beihoff et al. | 361/45 |
| 5,206,596 | 4/1993 | Beihoff et al. | 324/536 |
| 5,208,542 | 5/1993 | Tennies et al. | 324/544 |
| 5,223,795 | 6/1993 | Blades | 324/536 |
| 5,224,006 | 6/1993 | MacKenzie et al. | 361/45 |
| 5,257,157 | 10/1993 | Epstein | 361/111 |
| 5,280,404 | 1/1994 | Ragsdale | 361/113 |
| 5,286,933 | 2/1994 | Pham | 218/119 |
| 5,307,230 | 4/1994 | MacKenzie | 361/96 |
| 5,334,939 | 8/1994 | Yarbrough | 324/424 |
| 5,353,014 | 10/1994 | Carroll et al. | 340/638 |
| 5,359,293 | 10/1994 | Boksiner et al. | 324/544 |
| 5,363,269 | 11/1994 | McDonald | 361/45 |
| 5,383,084 | 1/1995 | Gershen et al. | 361/113 |
| 5,388,021 | 2/1995 | Stahl | 361/56 |
| 5,412,526 | 5/1995 | Kapp et al. | 361/56 |
| 5,414,590 | 5/1995 | Tajali | 361/669 |
| 5,434,509 | 7/1995 | Blades | 324/536 |
| 5,444,424 | 8/1995 | Wong et al. | 335/172 |
| 5,446,431 | 8/1995 | Leach et al. | 335/18 |
| 5,448,443 | 9/1995 | Muelleman | 361/111 |
| 5,459,630 | 10/1995 | MacKenzie et al. | 361/45 |
| 5,493,278 | 2/1996 | MacKenzie et al. | 340/638 |
| 5,510,946 | 4/1996 | Franklin | 361/56 |
| 5,512,832 | 4/1996 | Russell et al. | 324/522 |
| 5,519,561 | 5/1996 | Mrenna et al. | 361/105 |
| 5,531,617 | 7/1996 | Marks | 439/723 |
| 5,561,605 | 10/1996 | Zuercher et al. | 364/483 |
| 5,568,371 | 10/1996 | Pitel et al. | 363/39 |
| 5,578,931 | 11/1996 | Russell et al. | 324/536 |
| 5,590,012 | 12/1996 | Dallar | 361/113 |
| 5,602,709 | 2/1997 | Dabbagh | 361/85 |
| 5,608,328 | 3/1997 | Sanderson | 324/529 |
| 5,659,453 | 8/1997 | Russell et al. | 361/93 |
| 5,691,869 | 11/1997 | Engel et al. | 361/42 |

ARCING FAULT DETECTION SYSTEM
INSTALLED IN A PANELBOARD

FIELD OF THE INVENTION

The present invention relates generally to protective devices in electrical distribution systems having multiple branch circuits. More particularly, the present invention relates to an arcing fault detection module installed in a panelboard and integrated with other protective devices into a system which protects one or more branch circuits from electrical hazards.

BACKGROUND OF THE INVENTION

Electrical systems in residential, commercial and industrial applications usually include a panelboard for receiving electrical power from a utility source. The electrical power is then delivered from the panelboard to designated branch circuits supplying one or more loads. Typically, various types of protective devices are installed in the panelboard to reduce the risk of injury, damage or fires.

Circuit breakers are a well known type of protective device which may be installed in the panelboard of an electrical distribution system. Circuit breakers are designed to trip open and interrupt an electric circuit in response to detecting overloads and short circuits. Overload protection is provided by a thermal element which, when heated by the increased current, will cause the circuit breaker to trip and interrupt the power. This can occur when too many loads draw power from the same branch circuit at the same time, or when a single load draws more power than the branch circuit is designed to carry. Short circuit protection is provided by an electromagnetic element that trips when sensing high current flow. Additionally, many circuit breakers provide protection against "ground faults" which occur when current flows from a hot conductor to ground through a person or object.

Surge arresters are another common type of protective device, provided to protect the electrical system from voltage surges which may be caused by lightning or switching transients. Surge arresters generally are either mounted in the panelboard of an electrical distribution system or occupy circuit breaker positions in the panelboard.

Another type of protective device that may be mounted within a panelboard of an electrical distribution system is an arcing fault detector. Arcing fault detectors are designed to trip open and interrupt an electric circuit (or signal an external device such as a circuit breaker to trip open and interrupt an electric circuit) in response to arcing faults, which occur when electric current "arcs" or flows through ionized gas between two ends of a broken conductor, between two conductors supplying a load, or between a conductor and ground. Arcing faults typically result from corroded, worn or aged wiring or insulation, loose connections, wiring damaged by nails or staples through the insulation, and electrical stress caused by repeated overloading, lightning strikes, etc. The presence of an arcing fault creates a significant fire hazard because it generates heat which may ignite the conductor insulation and adjacent combustible materials. Standard circuit breakers or fuses typically do not trip in response to arcing faults because the load current associated with an arcing fault is typically below the level required to trip standard circuit breakers or fuses.

There are several types of arcing fault detectors known in the art. However, one problem associated with prior art arcing fault detectors is the detection of "false" arcing fault signals. A false arcing fault signal occurs when the presence of an arcing fault in one branch circuit is erroneously indicated as occurring in other branch circuits. Accordingly, in order to prevent or reduce the effects of this problem, there is a need for an "isolator" circuit designed to isolate the detection of an arcing fault to the particular branch circuit in which it occurred, in order to prevent false arcing fault indications in other branch circuits. Similar to the other protective devices described above, the arcing fault detector isolator circuit is preferably mounted within a panelboard of an electrical distribution system.

Where multiple protective devices are installed in a panelboard, each of the devices typically operate independently of one another without regard to the functions being performed by the other devices. This can result in an unnecessary duplication of functions or elements between devices. The duplication of functions between multiple protective devices increases the cost and complexity of each individual device and reduces or eliminates available space in the panelboard which may be needed for other protective devices or applications. In order to decrease the cost and complexity of each individual device and maximize available space in the panelboard, there is a need to either physically or functionally integrate one or more of the above protective devices into an overall protection system. Preferably, the integrated system will interrupt an electrical circuit in response to the detection of arcing faults, ground faults, overcurrents and/or voltage surges. The present invention is directed to satisfying or at least partially satisfying the aforementioned needs.

SUMMARY OF THE INVENTION

In accordance with one aspect of the present invention, there is provided an integrated protection system for an electrical distribution system including a panelboard for receiving and distributing power from a utility source. The panelboard receives power from the utility source through at least one line bus and a neutral bus. The panelboard distributes power to a plurality of branch circuits each having line and neutral conductors for delivering the power to a load. The line conductors are electrically connected to one of the line buses and the neutral conductors are electrically connected to the neutral bus. The panelboard includes a framework having a plurality of positions for attaching circuit protection devices to the plurality of branch circuits. The integrated protection system comprises a plurality of arcing fault detector modules and line interrupters, each attached to one of the positions in the panelboard framework. The arcing fault detector modules are adapted to detect the occurrence of an arcing fault in either of the selected number of branch circuits, while the line interrupters are adapted to disconnect the load from the power source in response to the detection of an arcing fault in one of the selected branch circuits. An isolation module attached to one of the positions in the panelboard may be provided for electrically isolating arcing fault signals to the branch circuit in which they occur.

In accordance with another aspect of the present invention, there is provided an integrated protection system for an electrical distribution system substantially as described above, comprising a plurality of combination arcing fault detector and line interrupter modules, each associated with one of the branch circuits and attached to one of the positions in the panelboard framework. An arcing fault detector portion of the module is designed to detecting the occurrence of an arcing fault in its respective branch circuit, while a line interrupter portion of the module is designed to disconnect the load from the power source in response to the occurrence of an arcing fault in the respective branch circuit. An isolation module attached to one of the positions in the panelboard may be provided for electrically isolating an arcing fault signal to the branch circuit on which it occurred.

In accordance with still another aspect of the present invention, there is provided an integrated protection system for an electrical distribution system substantially as described above, comprising a plurality of arcing fault detector modules and line interrupter modules. The line interrupter modules are each attached to one of the positions in the panelboard framework, while the arcing fault detector modules are attached externally to the line interrupter modules. The arcing fault detector modules are designed to detect the occurrence of an arcing fault in either of the branch circuits, while the line interrupter modules are designed to disconnect the load from the power source in response to the detection of an arcing fault in one of the branch circuits. An isolation module attached to one of the positions in the panelboard may be provided for electrically isolating arcing fault signals to the branch circuit on which they occurred.

BRIEF DESCRIPTION OF THE DRAWINGS

In the drawings, which comprise a portion of this disclosure:

FIG. 4b is a schematic diagram of an electrical circuit for implementing the isolation module illustrated in FIG. 4a;

FIG. 5b is a block diagram of the arcing fault detector module of FIG. 5a;

DETAILED DESCRIPTION

Figure 1A:
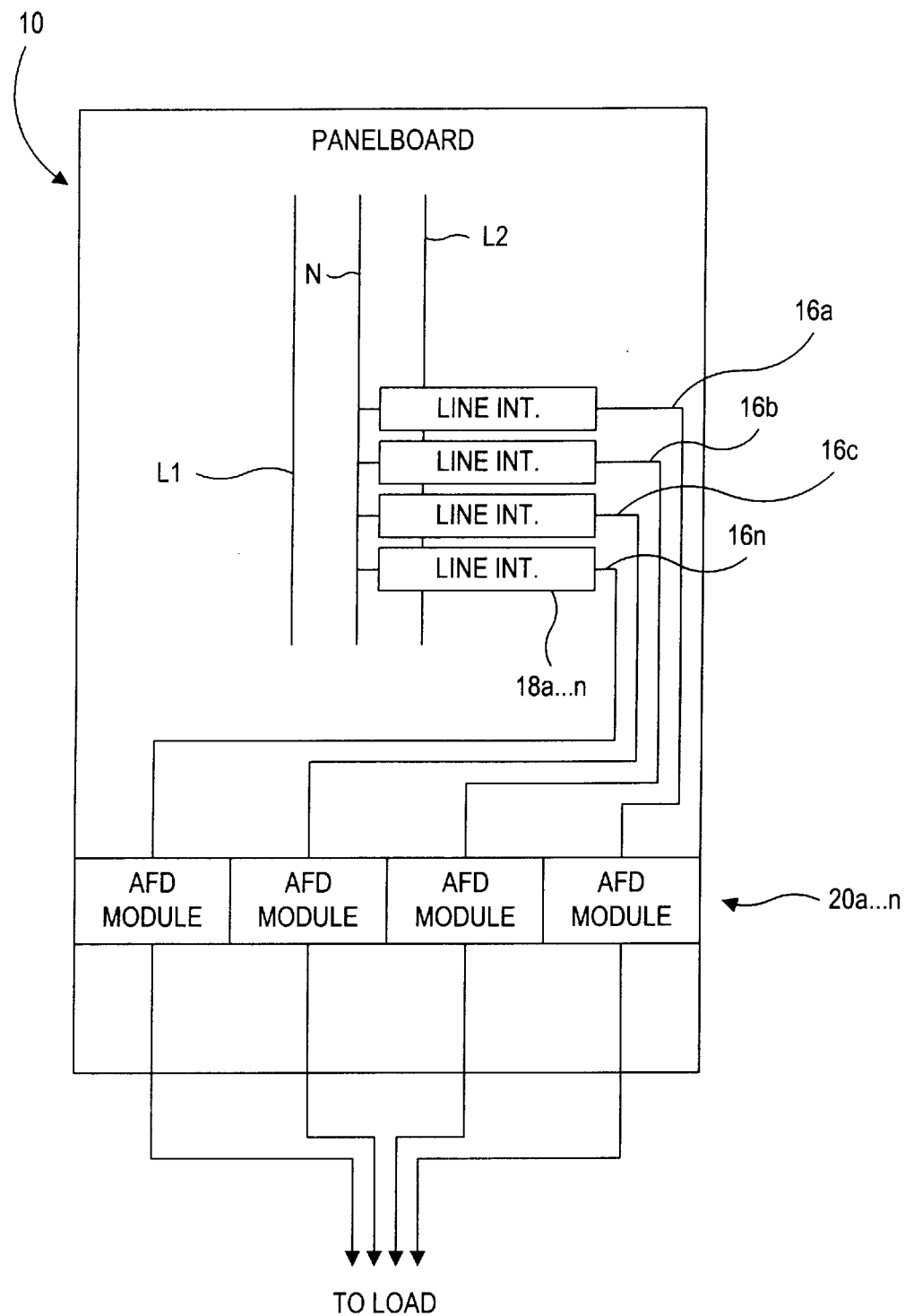
FIG. 1a is a block diagram of a panelboard including an integrated protection system according to one embodiment of the present invention.

Turning now to the drawings and referring first to FIG. 1a, there is depicted a panelboard 10 including an integrated protection system according to one embodiment of the present invention. As used herein, the term "panelboard" is intended to encompass electrical distribution devices having current capacities suitable for either residential, commercial or industrial uses. The panelboard 10 receives electrical power from a utility source through line buses L1 and L2 and a neutral bus N and distributes the power to loads in a plurality of branch circuits defined by line conductors 16a, 16b, 16c . . . 16n and neutral conductors (not shown). The line conductors 16a, 16b, 16c . . . 16n are electrically connected to one of the line buses L1, L2 and the neutral conductors are electrically connected to the neutral bus N. The panelboard 10 comprises a framework for attaching various circuit protection devices to the line and neutral conductors in either of the branch circuits.

Figure 1B:
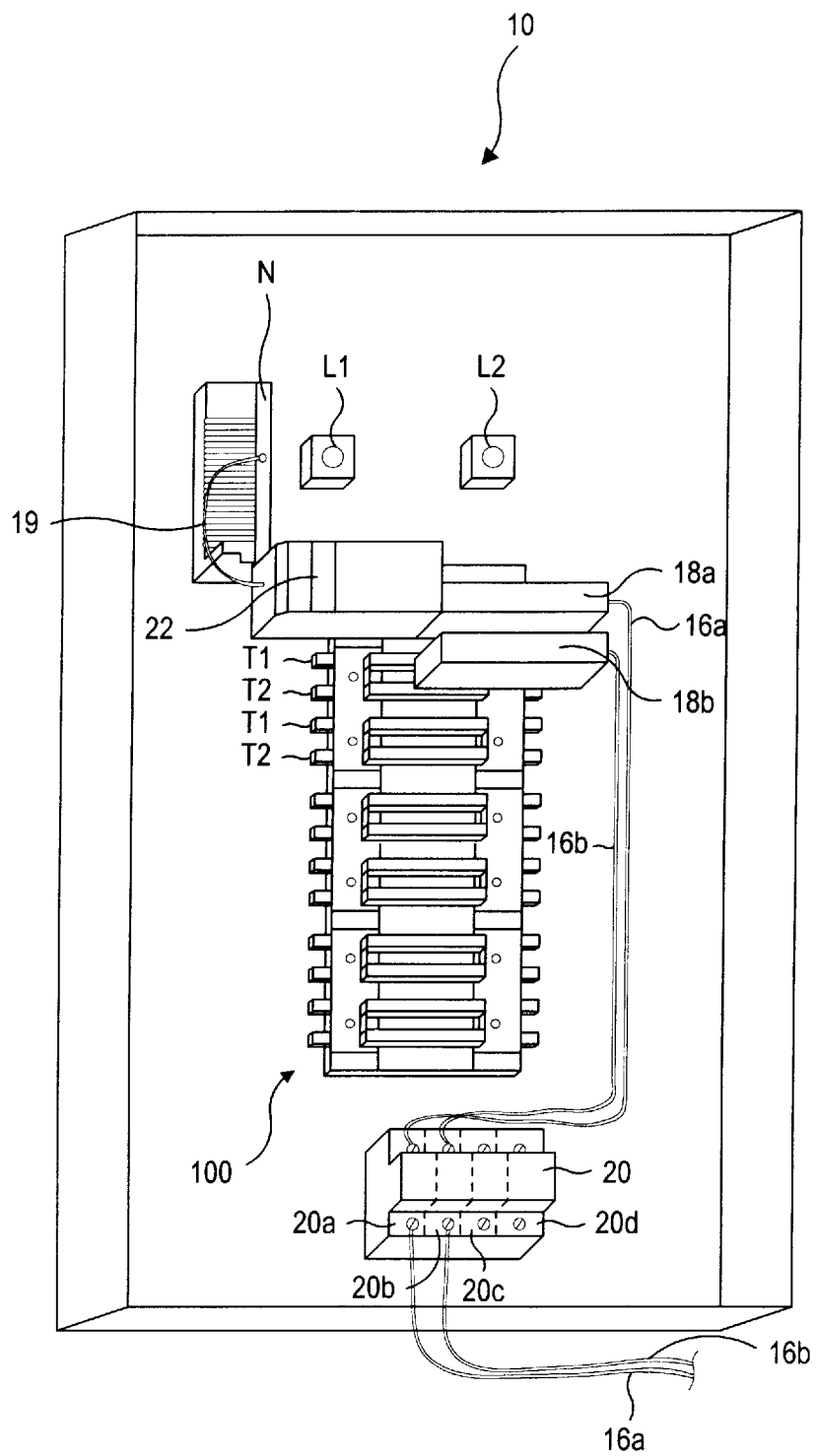
FIG. 1b is a perspective view of a panelboard including the integrated protection system of FIG: 1a with an isolation module at the distribution panel.

In the embodiment shown in FIG. 1a, the integrated protection system includes a plurality of line interrupters 18a, 18b, 18c . . . 18n and arcing fault detector modules 20a, 20b, 20c . . . 20n (hereinafter "AFD modules"). Each of the line interrupters 18a, 18b, 18c . . . 18n are designed to protect the branch circuit to which they are connected from overcurrents by disconnecting the load from the power source in response to the occurrence of an overload or short circuit in the branch circuit. The line interrupters may be plugged onto or bolted to one of the line buses L1 or L2 as shown in FIGS. 1a or 1b, or they may be mounted separately within the panelboard 10 and connected to one of the line buses L1 or L2 by wire. The line interrupters may comprise a circuit breaker, fuse, relay, automatic switch or any suitable means known in the art.

Figure 9:
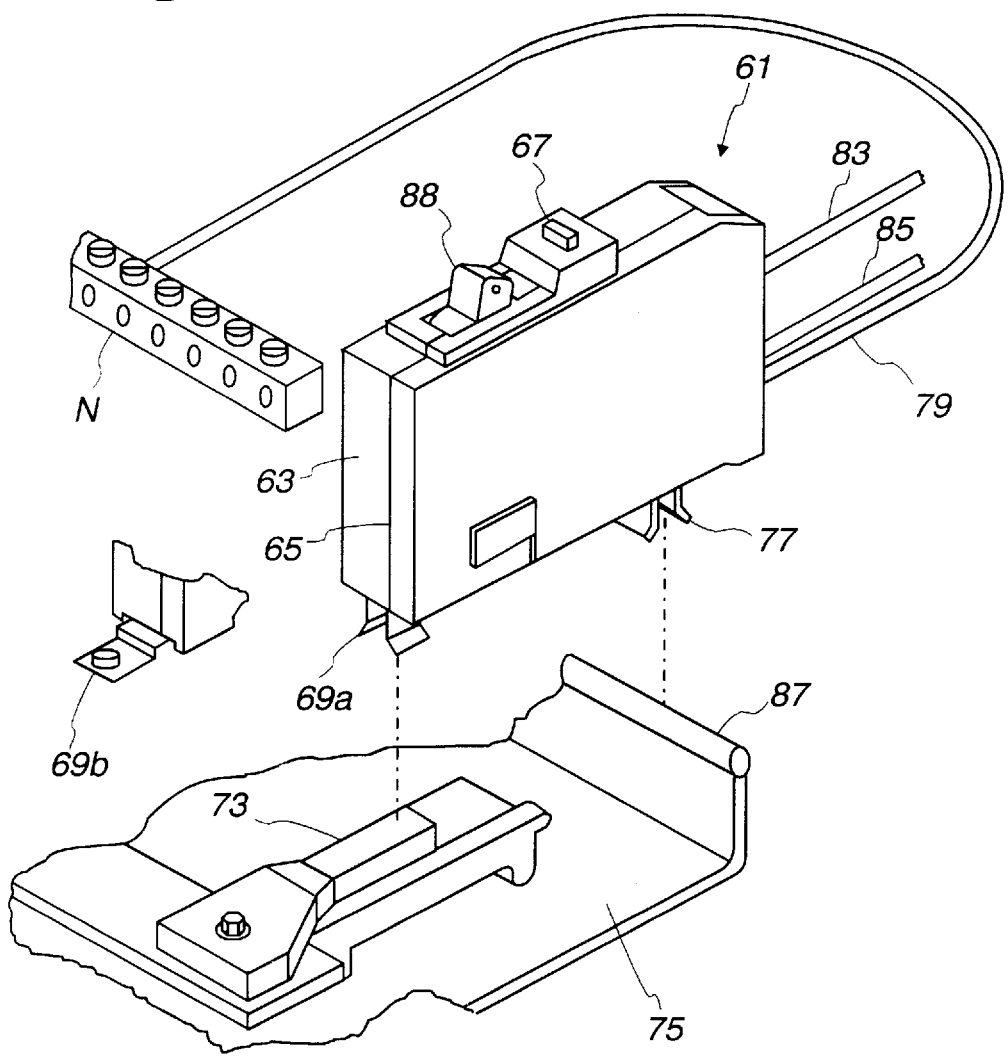
FIG. 9 is a perspective view of a housing which may be mounted to a panelboard and which may include the line interrupter or combination module of FIGS. 1–3.

In one embodiment of the present invention, the line interrupters comprise circuit breakers which are connected to the panelboard 10 by means of a housing 61 as depicted in FIG. 9. The housing 61 is comprised of an electrically-insulating base 63 closed at one face by a detachable cover 65 which together enclose the components of the circuit breaker. A clip 77 is provided for mounting the housing 61 to a mounting bracket 87 in the panelboard 10 of an electrical distribution system. An electrically-conductive jaw-like terminal 69a or bolt terminal 69b extends through the base 63 to be externally connected to one or both of the line bus bars L1 or L2 within the panelboard 10. Similarly, a panel neutral conductor 79 extends through the housing 61 for connection to the neutral bar N in the panelboard 10. External connections to the line and neutral conductors leading to the load side of the line interrupters are provided through a load line conductor 83 and load neutral conductor 85, respectively. An operating handle 88 and test button 67 are mounted through separate openings in the base 63 for external manual operation of the circuit breaker.

Figure 10:
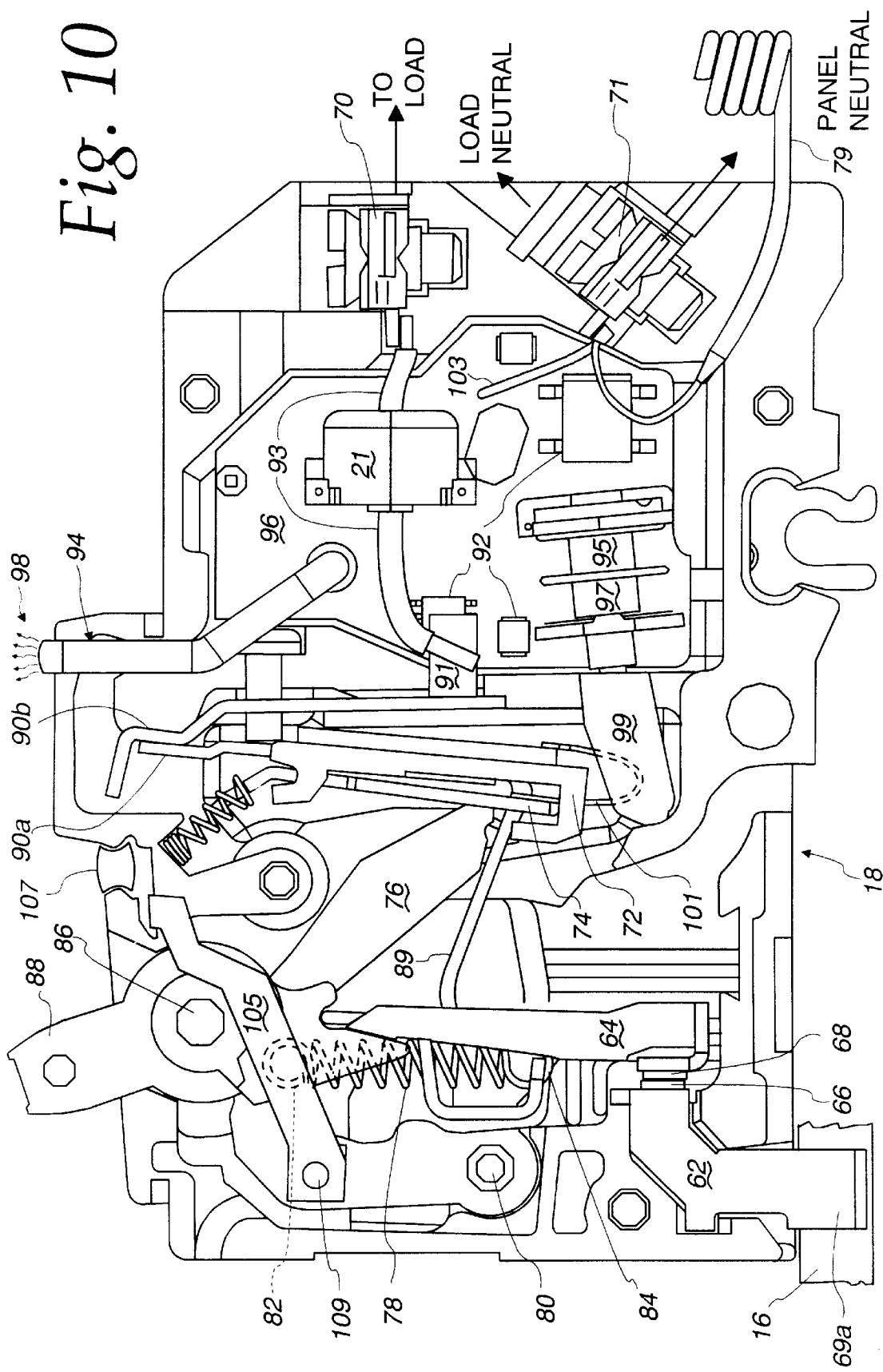
FIG. 10 is a top view of a combination module installed within the housing of FIG. 9 in a closed (on) position according to one embodiment of the present invention.

The circuit breaker may be any of several types known in the art including, for example, those with ground fault interruption (GFI) capability such as that disclosed in U.S. Pat. No. 5,446,431, assigned to the instant assignee and incorporated herein by reference. One type of circuit breaker which may be utilized as one of the line interrupters 18a . . . 18n of the present invention is illustrated in FIG. 10. As depicted in FIG. 10, the circuit breaker 18 is in a closed position, enabling line current to flow completely through the circuit breaker and toward the load of a designated branch circuit. Line current enters the circuit breaker 18 through the jaw-like terminal 69a and flows through a stationary contact carrier 62 integral with the jaw-like terminal 69a. The stationary contact carrier 62 has a stationary contact 66 mounted thereon. When in the closed position, the stationary contact 66 abuts against a movable contact 68 which is mounted to a movable contact carrier 64. Line current thereby flows from the stationary contact carrier 62 to the movable contact carrier 64 through the stationary and movable contacts 66 and 68, respectively.

A pigtail conductor 89 is electrically connected at one end to the movable contact carrier 64 and at another end to a yoke 72, enabling line current to flow from the movable contact carrier 64 to the yoke 72 when the circuit breaker 18 is in a closed position. A bimetal conductor 90a composed of two dissimilar thermostat materials is electrically connected to the yoke 72. The bimetal conductor 90a is electrically connected to a conductive member 90b, which includes a conductive plate 91 at one end which is electrically connected to an internal conductor 93. When the circuit breaker 18 is in the closed position, electrical current flows from the yoke 72 through the bimetal conductor assembly 90 to the conductive plate 91 and through the internal conductor 93. In the embodiment shown in FIG. 10, the circuit breaker 18 is equipped with a sensing coil 21 for detecting arcing faults. Thus, the current flowing through the internal conductor 93 passes through the sensing coil 21 before exiting the circuit breaker 18. However, with respect to the integrated protection system of FIGS. 1a and 1b, the circuit breaker 18 will most likely not include the sensing coil 21 because arcing fault detection will be accomplished by the arcing fault detection modules 20a . . . 20n rather than by the circuit breaker 18. In either case, the line current ultimately exits the circuit breaker 18 through a load terminal block 70 to which the load line conductor 83 (FIG. 9) may be attached to provide the line current to a load. The load terminal block 70 is defined by two conductive plates adapted to be clamped together by a screw. The load line conductor 83 may be attached by inserting it between the two conductive plates and tightening the screw of the load terminal block 70.

The circuit breaker 18 also includes a neutral terminal block 71 to which the load neutral conductor 85 (FIG. 9) may be attached in a similar fashion as the load line conductor 83 is attached to the load terminal block 70. The miniature circuit breaker further includes an internal neutral conductor 103 electrically connected at one end to the circuit board 96 and connected at another end to the panel neutral conductor 79 described in relation to FIG. 9. In embodiments with ground fault interruption (GFI) circuitry, the panel neutral conductor 79 is routed through the sensor 21 along with the internal line conductor 93 to permit sensing of an imbalance of current flow between the internal line and neutral conductors 93 and 103 as is known in the art.

Figure 11:
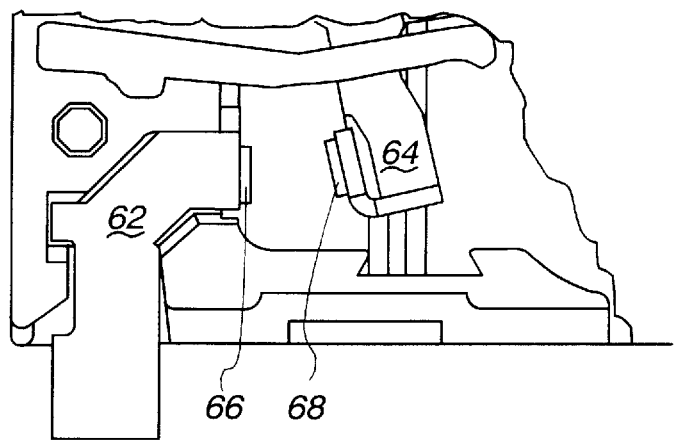
FIG. 11 is a top view of a portion of the combination module of FIG. 10 in an open (off/tripped) position.

Now turning to FIG. 11, a portion of the circuit breaker 18 is shown in an open position. In the open position, the movable contact carrier 64 is rotated away from the stationary contact carrier 62, causing the movable contact 68 to become separated from the stationary contact 66 and interrupt the electric current flowing through the circuit breaker 18. The circuit breaker 18 may be tripped open in any of several ways, including manual control and in response to thermally and electromagnetically-sensed overload conditions and ground fault conditions. As the mechanism for tripping open the circuit breaker 18 is described in detail in U.S. Pat. No. 5,446,431, it will be described only briefly herein.

Returning again to FIG. 10, the circuit breaker 18 may be moved between the open and closed positions by a user manually moving the operating handle 88 to the right or left, respectfully, causing corresponding movement of the top of the movable contact carrier 64 to the left or right of a pivot point. A toggle spring 78 is connected at one end to the trip lever 76 and at another end to the bottom of the movable contact carrier 64. When the top of the movable contact carrier 64 is left of the pivot point, the toggle spring 78 serves to bias the bottom of the movable contact carrier 64 to the closed position. Conversely, when the top of the movable contact carrier 64 is right of the pivot point, the toggle spring 78 biases the bottom of the movable contact carrier to the open position.

The circuit breaker 18 is designed to be tripped open in response to overcurrent conditions caused by overloads or short circuits in the branch circuit. Upon the occurrence of a moderately sustained overload condition when the contacts 66 and 68 are in a closed position, the bimetal conductor assembly 90 becomes heated and bends to the right. Bending of the bimetal conductor assembly 90 causes an armature 74 and yoke 72 to swing counterclockwise and release a trip lever 76. The trip lever 76 rotates clockwise about pin 80, causing the toggle spring 78 to pull the bottom of the movable contact carrier 64 away from the stationary contact 66 and interrupt the current path.

Similarly, upon the occurrence of an extensive current overload condition, a high magnetic flux field is created around the yoke 72. The armature 74 is drawn toward the yoke 72 by the magnetic field, causing the trip lever 76 to become released from the armature 74. As described in relation to thermal trips, release of the trip lever 76 from the armature 74 causes the toggle spring to pull the bottom of the movable contact carrier 64 away from the stationary contact 66 and interrupt the current path.

Figure 5A:
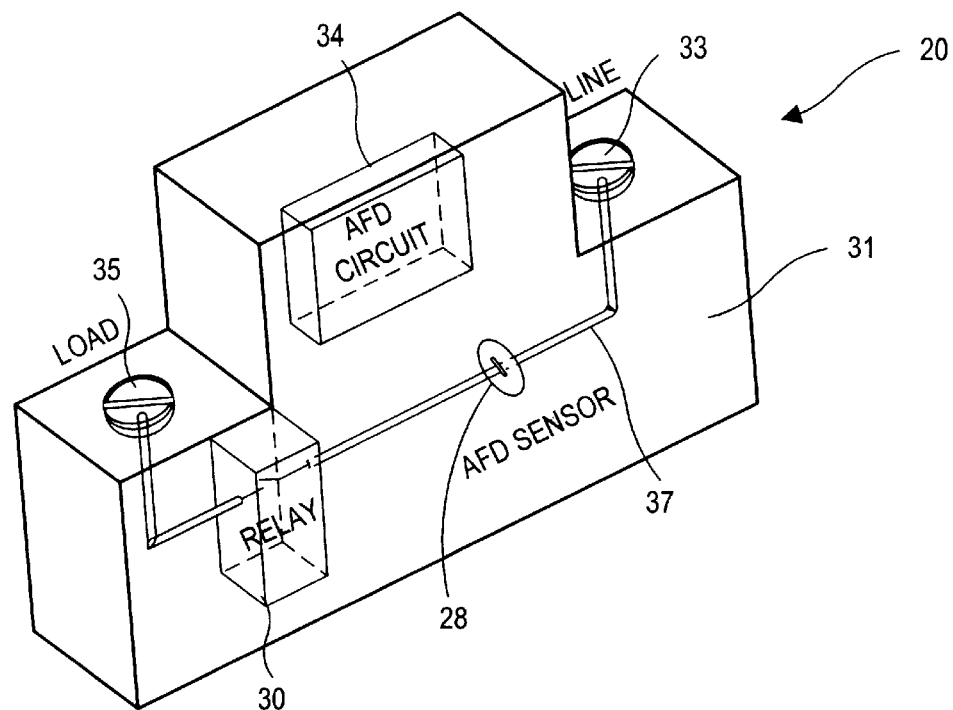
FIG. 5a is a perspective view of an arcing fault detector module which may be used in the integrated protection systems of FIG. 1a and 1b.
Figure 5B:
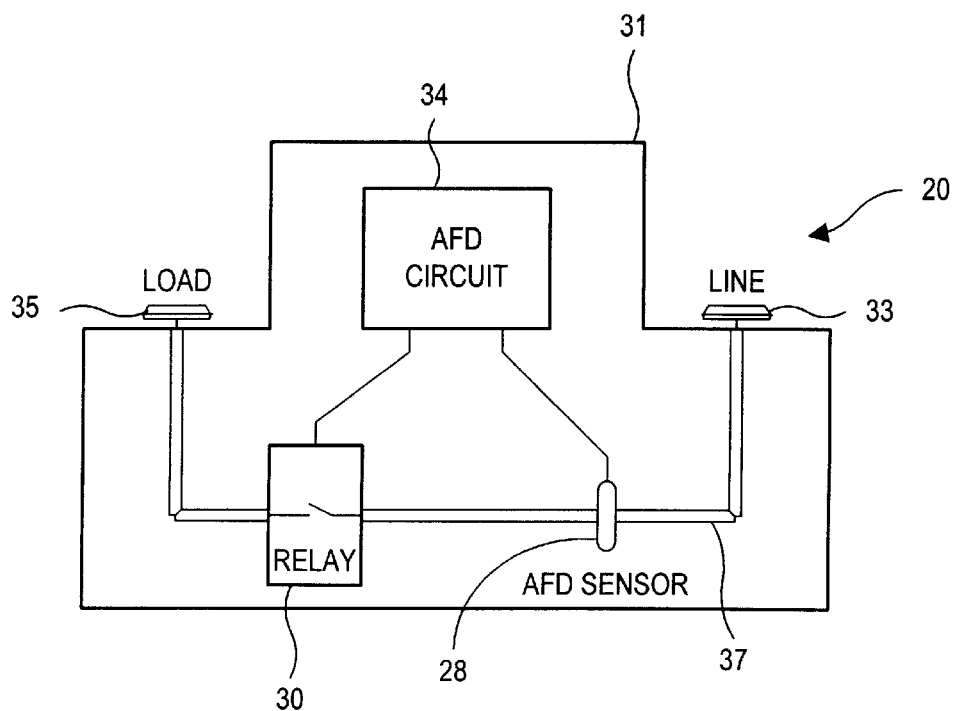

Now turning to FIGS. 5a and 5b, there is depicted an AFD module 20 which may be utilized as one of the AFD modules 20a . . . 20n in FIG. 1a or 1b. The AFD module 20 comprises a housing 31 which is adapted to be connected to one of the positions in the panelboard. A line terminal 33 is provided for connecting the AFD module 20 to one of the line conductors 16a . . . 16n by wire. Line current enters the AFD module 20 through the line terminal 33, flows through the AFD module 20 via internal line conductor 37 and exits the AFD module 20 via load terminal 35 before being supplied to the load. An AFD sensor 28 surrounds the internal line conductor 37 and senses the rate of change of electrical current flowing through the internal line conductor 37. The rate-of-change signal from the sensor 28 is supplied to the AFD circuit 34, which produces a pulse each time the rate-of-change signal increases above a selected threshold. The rate-of-change signal and/or the pulses produced therefrom are filtered to eliminate signals or pulses outside a selected frequency range. The final pulses are then monitored to detect when the number of pulses that occur within a selected time interval exceeds a predetermined threshold. In the event that the threshold is exceeded, the detector 34 generates an arcing-fault-detection signal that can be used to trip the line interrupter 30. The line interrupter 30 in the AFD module 20 is designed to interrupt power in the branch circuit resulting from an arcing fault, not an overcurrent (overload or short circuit) condition. Accordingly, as shown in FIGS. 5a and 5b, it is preferred that the line interrupter 30 in the AFD module 20 comprise a relay rather than a circuit breaker such as that described in relation to FIGS. 10 and 11.

In one embodiment of the present invention, the AFD sensor 28 comprises a toroidal sensor having an annular core encompassing the internal line conductor 37, with the sensing coil wound helically on the core. The core is made of magnetic material such as a ferrite, iron, or molded permeable powder capable of responding to rapid changes in flux. A preferred sensor uses a ferrite core wound with 200 turns of 24–36 gauge copper wire to form the sensing coil. An air gap may be cut into the core to reduce the permeability to about 30. The core material preferably does not saturate during the relatively high currents produced by parallel arcs, so that arc detection is still possible at those high current levels.

Other means for sensing the rate of change of the current in a line conductor are contemplated by the present invention. By Faraday's Law, any coil produces a voltage proportional to the rate of change in magnetic flux passing through the coil. The current associated with an arcing fault generates a magnetic flux around the conductor, and the coil of the sensor 28 intersects this flux to produce a signal. Other suitable sensors include a toroidal transformer with a core of magnetic material or an air core, an inductor or a transformer with a laminated core of magnetic material, and inductors mounted on printed circuit boards. Various configurations for the sensor core are contemplated by the present invention and include toroids which have air gaps in their bodies.

Preferably, the rate-of-change signal produced by the sensor 28 represents only fluctuations in the rate of change within a selected frequency band. The sensor bandpass characteristic is preferably such that the lower frequency cut-off point rejects the power frequency signals, while the upper frequency cut-off point rejects the high frequency signals generated by noisy loads such as a solder gun, electric saw, electric drill, or like appliances, equipment, or tools. The resulting output of the sensor 28 is thus limited to the selected frequency band associated with arcing faults, thereby eliminating or reducing spurious fluctuations in the rate-of-change signal which could result in nuisance tripping. As an example, the sensor bandpass characteristic may have: (1) a lower frequency cut-off point or lower limit of 60 Hz so as to reject power frequency signals, and (2) an upper frequency cut-off point or upper limit of approximately 1 MHz so as to effectively reject high frequency signals associated with noisy loads. These specific frequency cut-off points for the sensor bandpass characteristic are by way of example only, and other appropriate frequency cut-off limits may be adopted depending upon actual frequency ranges for the power signals as well as the noisy load signals.

The desired bandpass characteristic is realized by appropriately selecting and adjusting the self-resonant frequency of the sensor. The current-type sensor is selected to have a predetermined self-resonant frequency which defines associated upper and lower frequency cut-off or roll-off points for the operational characteristics of the sensor. Preferably, the current-type sensor is designed to exhibit the desired bandpass filtering characteristic as it operates to detect the rate of change of current variations within the load line being monitored. The present invention contemplates other means for bandpass filtering the signal output within the selected frequency band. For example, a bandpass filter or a combination of filters in a circuit can be used to attenuate frequencies above or below the cut-off points for the selected frequency band.

Figure 5C:
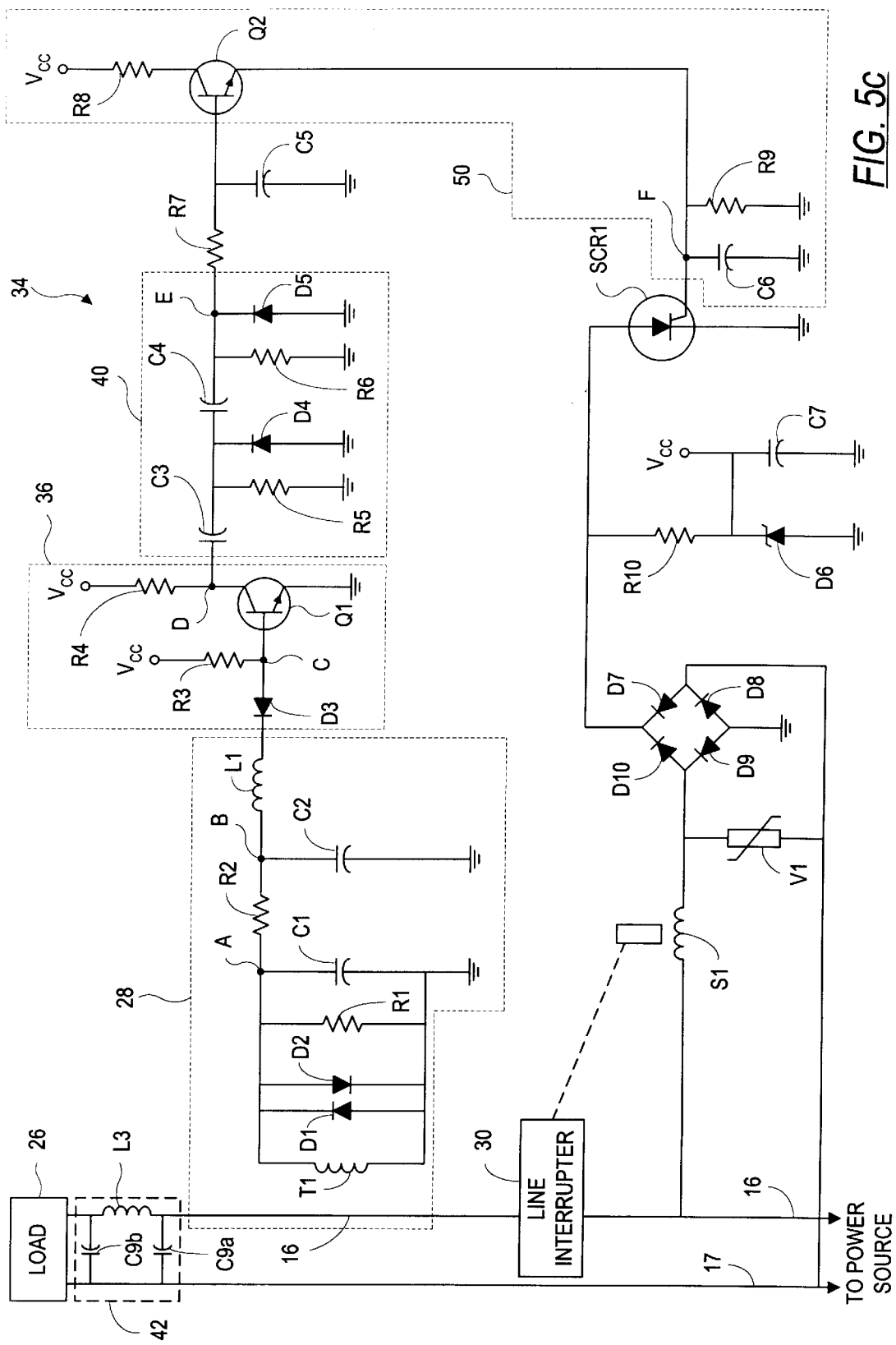
FIG. 5c is a schematic diagram of an electrical circuit for implementing the arcing fault detector module illustrated in FIGS. 5a and 5b.

FIG. 5c illustrates a preferred circuit for the arcing fault detector module 20. The AFD sensor 28 produces the desired rate-of-change signal (commonly referred to as a "di/dt signal") in the form of an output voltage which is connected to a comparator circuit 36 through a filtering network in the sensor and a diode D3. The rate-of-change signal originates in the sensor coil T1 which is wound on a core surrounding the line conductor 16. Connected in parallel with the sensor coil T1 are a pair of diodes D1 and D2 which serve as clamping devices during high-power transient conditions. A resistor R1 in parallel with the diodes D1 and D2 dampens self-ringing of the sensor, during high-power transients. A pair of capacitors C1 and C2 in parallel with the resistor R1, and a resistor R2 and an inductor L1 connected in series to the input to the comparator 36, are tuned to assist in attaining the desired rolloff characteristics of the filtering network formed thereby. For example, with the illustrative values listed below for the components of the circuit of FIG. 5c, the sensor has a passband extending from about 10 KHz to about 100 KHz, with sharp rolloff at both sides of the passband.

Figure 6A:
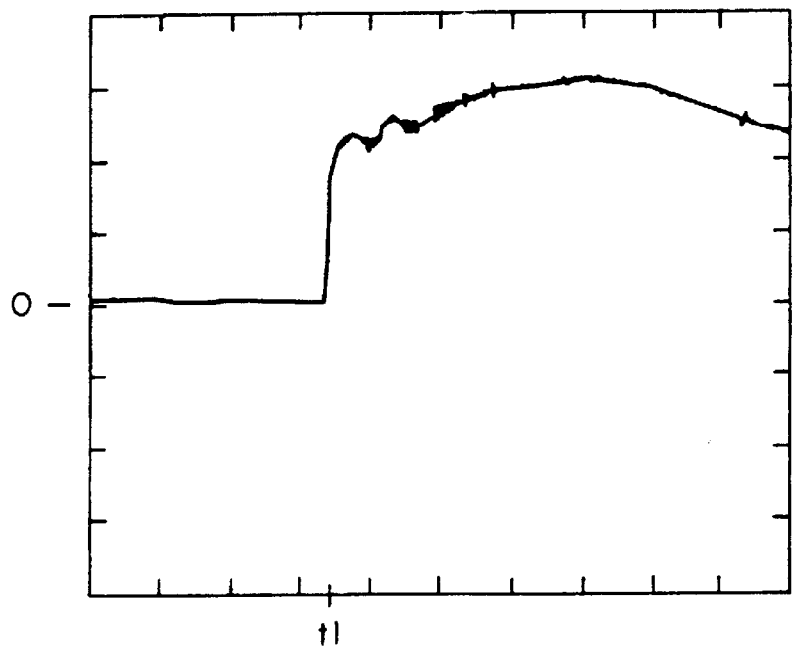
FIGS. 6a through 6g are waveforms at various points in the circuit of FIG. 5c.
Figure 6B:
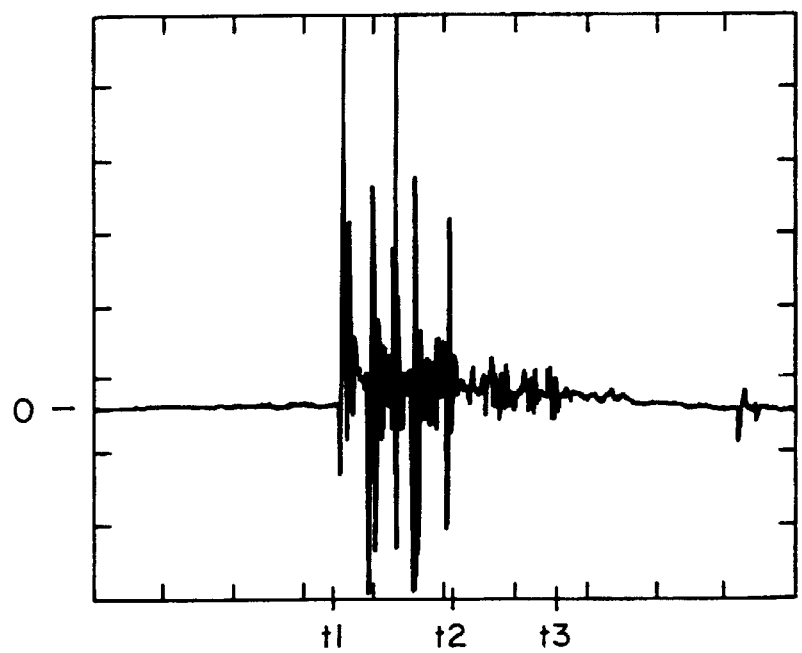

The operation of the circuit of FIG. 5c can be more clearly understood by reference to the series of waveforms in FIGS. 6a through 6g. FIG.6a is an actual waveform from an oscilloscope connected to a line conductor 16 carrying a–c. power at 60 Hz and experiencing a high-frequency disturbance beginning at time t1. Because the high-frequency disturbance is within the frequency range to which the sensor 21 is sensitive (e.g., from about 10 KHz to about 100 KHz), the disturbance results in a burst of high-frequency noise in the di/dt output signal (FIG. 6b) from the sensor 28 (at point A in the circuit of FIG. 5c), beginning at time t1. The noise burst has a relatively high amplitude from time t1 until approximately time t2, and then continues at a low amplitude from time t2 to about time t3.

In the comparator 36, the magnitude of the rate-of-change signal from the sensor 28 is compared with the magnitude of a fixed reference signal, and the comparator 36 produces an output voltage only when the magnitude of the rate-of-change signal crosses that of the reference signal. This causes the detector 34 to ignore low-level signals generated by the sensor 28. All signals having a magnitude above the threshold level set by the magnitude of the reference signal are amplified to a preset maximum value to reduce the effect of a large signal. In the comparator 36, a transistor Q1 is normally turned on with its base pulled high by a resistor R3. A diode D3 changes the threshold and allows only the negative pulses from the sensor 21 to be delivered to the base of transistor Q1. When the signal to the comparator drops below the threshold level (minus 0.2 volt for the circuit values listed below), this causes the transistor Q1 to turn off. This causes the collector of the transistor Q1 to rise to a predetermined voltage, determined by the supply voltage $V_{cc}$, a resistor R4 and the input impedance of a single-shot pulse generator circuit 40. This collector voltage is the output of the comparator circuit 36. The collector voltage remains high as long as the transistor Q1 is turned off, which continues until the signal from the sensor 28 rises above the threshold level again. The transistor Q1 then turns on again, causing the collector voltage to drop. The end result is a pulse output from the comparator, with the width of the pulse corresponding to the time interval during which the transistor Q1 is turned off, which in turn corresponds to the time interval during which the negative-going signal from the sensor 28 remains below the threshold level of the comparator.

Figure 6C:
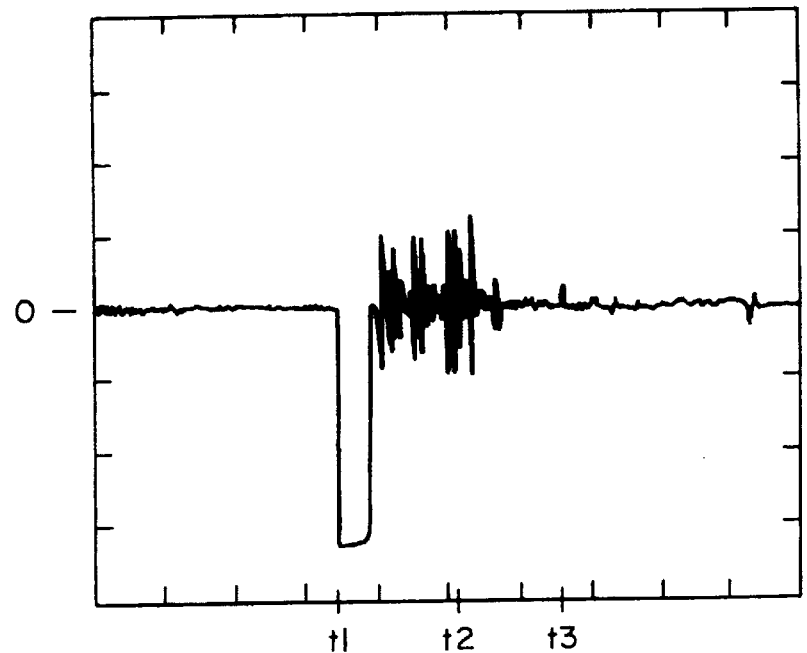
Figure 6D:
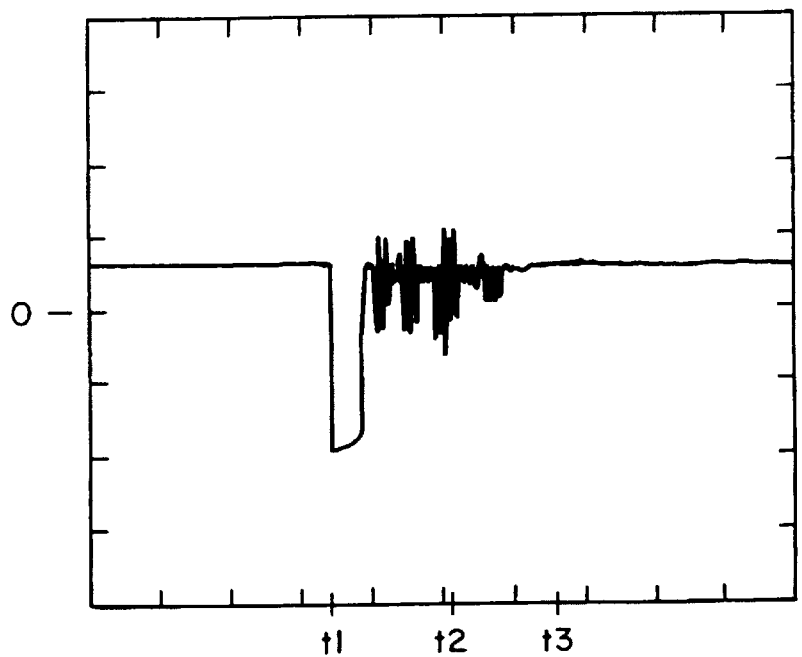

The noise burst in the sensor output is filtered to produce the waveform shown in FIG. 6c at point B in the circuit of FIG. 5c. The waveform at point C in the circuit of FIG. 5c is shown in FIG. 6d, and it can be seen that the amplitude has been reduced and a d–c. offset has been introduced by summing the filtered di/dt signal with a d–c. bias from the supply voltage $V_{cc}$ at point C. This is the input signal to the base of the transistor Q1.

Figure 6E:
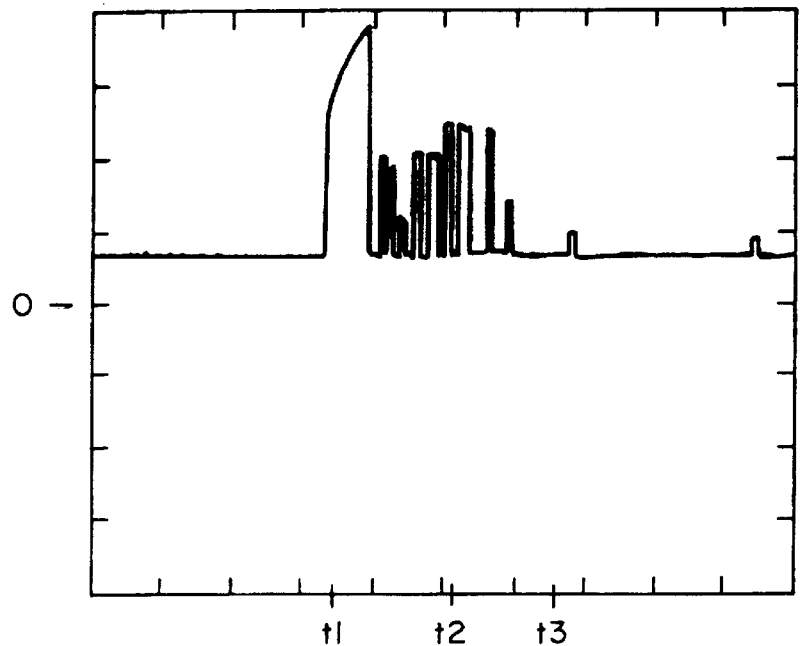

The output of the transistor Q1 is a series of positive-going pulses corresponding to the negative-going peaks in the input signal. The transistor output, at point D in the circuit of FIG. 5c, is shown in FIG. 6e. It can be seen that the transistor circuit functions as a comparator by producing output pulses corresponding only to negative-going peaks that exceed a certain threshold in the filtered di/dt signal shown in FIG. 6c. At this point in the circuit, the pulses vary in both width and amplitude, as can be seen in FIG. 6e.

Figure 6F:
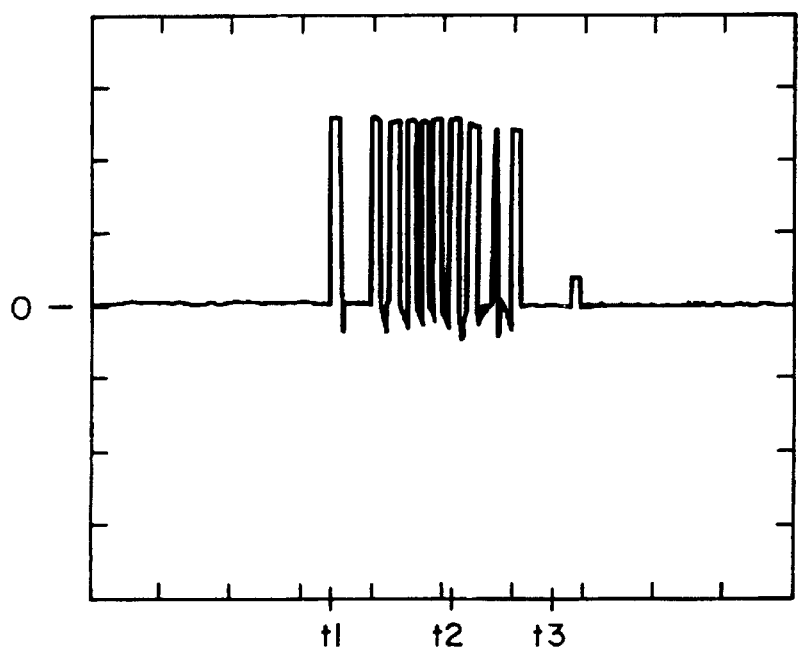

The variable-width and variable-amplitude pulses of FIG. 6e are converted to a series of pulses of substantially constant width and amplitude by the single-shot pulse generator circuit 40. This circuit includes a pair of capacitors C3 and C4 connected in series to the collector of the transistor Q1, and two resistor-diode pairs connected in parallel from opposite sides of the capacitors C3 and C4 to ground. The output of this circuit 40, at point E in the circuit of FIG. 5c, is shown in FIG. 6f. Although all the pulses shown in FIG. 6f are of substantially the same size, larger or smaller pulses may be produced by di/dt spikes that are excessively large or excessively small. The vast majority of the pulses at point E, however, are substantially independent of the amplitude and duration of the corresponding spikes in the di/dt signal, provided the spikes are large enough to produce an output pulse from the comparator 36.

The substantially uniform pulses produced by the circuit 40 are supplied to the base of a transistor Q2 through a current-limiting resistor R7. A capacitor C5 connected from the transistor base to ground improves the sharpness of the roll-off of the bandpass filtering. The transistor Q2 is the beginning of an integrator circuit 50 that integrates the pulses produced by the circuit 40. The pulses turn the transistor on and off to charge and discharge a capacitor C6 connected between the transistor emitter and ground. A resistor R9 is connected in parallel with the capacitor C6, and a resistor R8 connected between the supply voltage and the collector of the transistor Q2 determines the level of the charging current for the capacitor C6. The magnitude of the charge on the capacitor C6 at any given instant represents the integral of the pulses received over a selected time interval. Because the pulses are substantially uniform in width and amplitude, the magnitude of the integral at any given instant is primarily a function of the number of pulses received within the selected time interval immediately preceding that instant. Consequently, the value of the integral can be used to determine whether an arcing fault has occurred.

Figure 6G:
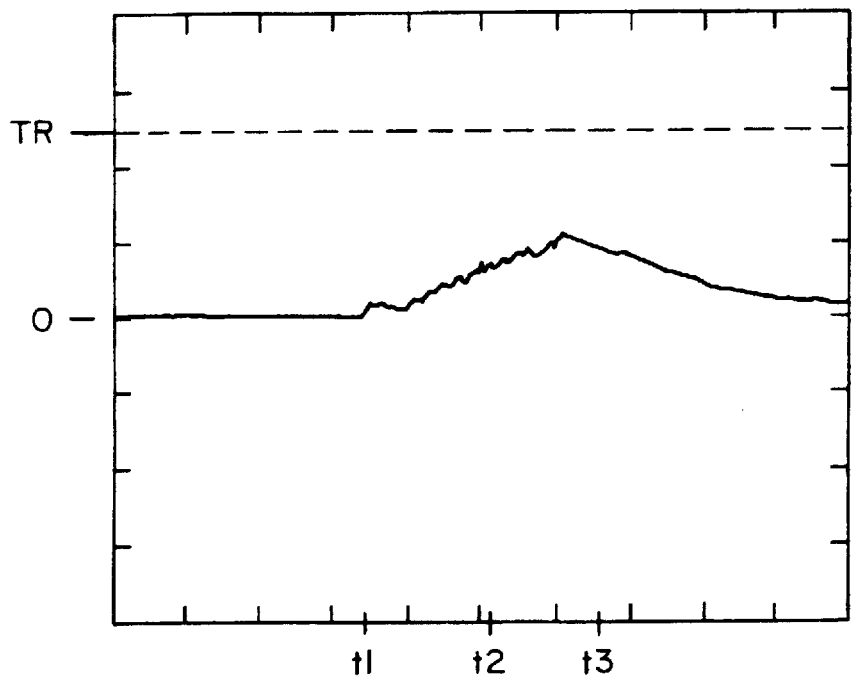

The integral signal produced by the circuit 50 is shown in FIG. 6g, taken at point F in the circuit of FIG. 5c. It can be seen that the integrator circuit charges each time it receives a pulse from the circuit 40, and then immediately begins to discharge. The charge accumulates only when the pulses appear at a rate sufficiently high that the charge produced by one pulse is less than the discharge that occurs before the next pulse arrives. If the pulses arrive in sufficient number and at a sufficient rate to increase the integral signal to a trip threshold level TR (FIG. 6g), SCR1 is triggered to trip the line interrupter 30. The circuit is designed so that this occurs only in response to a di/dt signal representing an arcing fault.

When SCR1 is turned on, a trip solenoid S1 is energized to disconnect the load from the circuit in the usual manner. Specifically, turning on SCR1 causes current to flow from line to neutral through a diode bridge formed by diodes D7–D10, thereby energizing the solenoid to open the circuit breaker contacts in the line 16 and thereby disconnect the protected portion of the system from the power source. The d–c. terminals of the diode bridge are connected across SCR1, and the voltage level is set by a zener diode D6 in series with a current-limiting resistor R10. A varistor V1 is connected across the diode bridge as a transient suppressor. A filtering capacitor C7 is connected across the zener diode D6. The trip circuit loses power when the circuit breaker contacts are opened, but of course the contacts remain open until reset.

One example of a circuit that produces the desired result described above is the circuit of FIG. 5c having the following values:

D1 1N4148
D2 1N4148
D3 1N4148
D4 1N4148
D5 1N4148
D6 27v zener
R1 3.01K
R2 1.3K
R3 174K
R4 27.4K
R5 10K
R6 10K
R7 10K
R8 4.2K
R9 4.75K
R10 24K
L1 3300 uH
L2 500 uH
L3 500 uH
C1 0.012 uF
C2 0.001 uF
C3 0.001 uF
C4 0.001 uF
C5 0.001 uF
C6 6.8 uF
C7 1.0 uF
C8 1.0 uF
Q1 2N2222A
Q2 2N2222A
SCR1 CR08AS-12 made by POWEREX-Equal
$V_{cc}$ 27v It will be understood that a number of modifications may be made in the circuit of FIG. 5c. For example, the discrete bandpass filter between the sensor and the comparator can be replaced with an active filter using an operational amplifier. As another example, a single-shot timer can be used in place of the single-shot pulse generator in the circuit of FIG. 5c. This circuit can receive the output signal from an active filter as the trigger input to an integrated-circuit timer, with the output of the timer supplied through a resistor to the same integrator circuit formed by the resistor R9 and capacitor C6 in the circuit of FIG. 5c.

Figure 7:
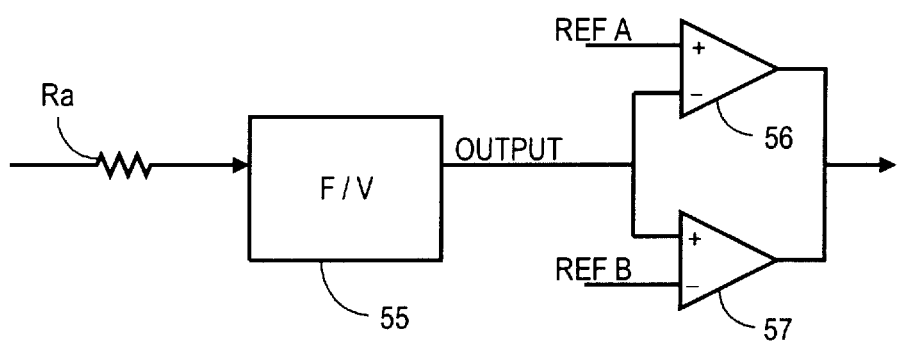
FIG. 7 is a schematic diagram of an alternate circuit for use in place of the comparator and single-shot pulse generator in the circuit of FIG. 5c.

FIG. 7 illustrates a frequency-to-voltage converter circuit that can be used in place of all the circuitry between point A and the integrator circuit in FIG. 5c. In this circuit, the signal from point A in FIG. 5c is supplied through a resistor Ra to a frequency/voltage converter integrated circuit 55 such as an AD537 made by Analog Devices Inc. The output of the integrated circuit 55 is fed to a pair of comparators 56 and 57 that form a conventional window comparator. Specifically, the output of the circuit 55 is applied to the inverting input of a comparator 56 and to the non-inverting input of a comparator 57. The other inputs of the comparators 56 and 57 receive two different reference signals A and B which set the limits of the window, i.e., the only signals that pass through the window comparator are those that are less than reference A and greater than reference B.

Figure 8:
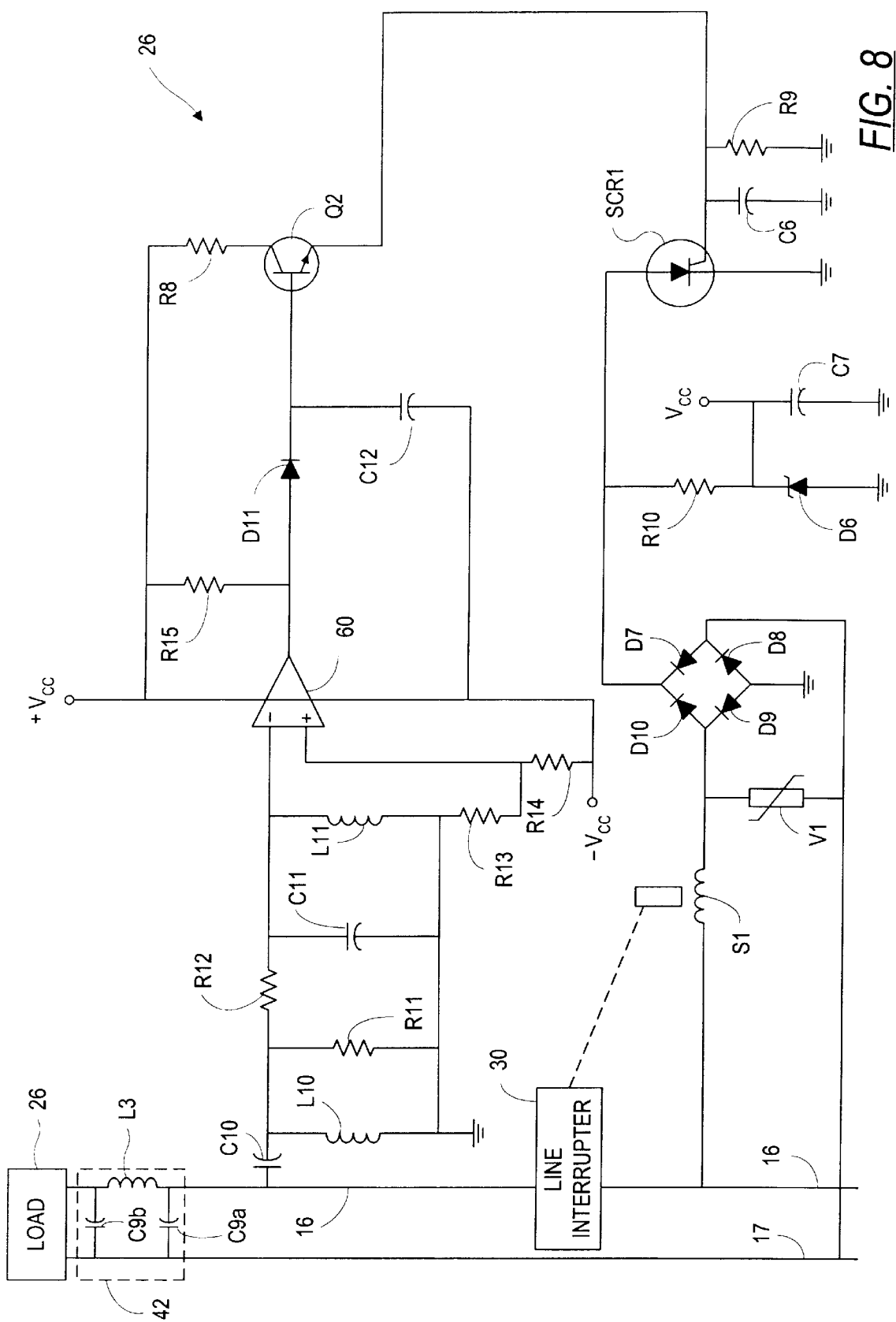
FIG. 8 is a schematic diagram of an alternative circuit for implementing the arcing fault detector module illustrated in FIGS. 5a and 5b.

FIG. 8 illustrates an alternative circuit for the AFD module 20 which senses the rate of change of the line voltage, i.e., dv/dt, rather than current. The sensor in this circuit is a capacitor C10 connected between a line conductor 16 and an inductor L10 leading to ground. The inductor L10 forms part of a bandpass filter that passes only those signals falling within the desired frequency band, e.g., between 10 KHz and 100 KHz. The filter network also includes a resistor R11, a capacitor C11 and a second inductor L11 in parallel with the first inductor L10, and a resistor R12 connected between the resistor R11 and the capacitor C11. The resistor R11 dampens the ringing between the capacitor C10 and the inductor L10, and the resistor R12 adjusts the threshold or sensitivity of the circuit. The inductors L10 and L11 provide low-frequency roll-off at the upper end of the pass band, and a capacitor C11 provides the high-frequency roll-off at the lower end of the pass band.

The capacitor C10 may be constructed by attaching a dielectric to the line bus so that the bus forms one plate of the capacitor. The second plate of the capacitor is attached on the opposite side of the dielectric from the bus. The sensor circuit is connected to the second plate.

The output of the bandpass filter described above is supplied to a comparator 60 to eliminate signals below a selected threshold, and to limit large signals to a preselected maximum amplitude. The filter output is applied to the inverting input of the comparator 60, through the resistor R12, while the non-inverting input receives a reference signal set by a voltage divider formed by a pair of resistors R13 and R14 connected between $V_{cc}$ and ground. The comparator 60 eliminates very low levels of signal recieved from the sensor. The comparator 60 is normally off when there is no arcing on the line conductor 16, and thus the comparator output is low. When the voltage signal from the sensor is more negative than the reference input (e.g., −0.2 volts), the output from the comparator goes high, and a forward bias is applied to the transistor Q2 that drives the integrator circuit. A capacitor C12 connected from the base of transistor Q2 to $-V_{cc}$ filters out high frequency noise. A diode D11 is connected between the comparator output and the base of the transistor Q2 to block negative signals that would discharge the capacitor C12 prematurely. The rest of the circuit of FIG. 8 is identical to that of FIG. 5c.

As shown in FIG. 5c and FIG. 8, the branch circuit may include a blocking filter 42 on the load side of the AFD sensor 28 for blocking false arcing fault signals or other nuisance output signals generated by normal operation of the load 26. The blocking filter 42 is connected between the sensor 28 and the load 26 to prevent false arcing fault signals from being delivered to the sensor 28. The preferred blocking filter includes a pair of capacitors C9a and C9b connected between the load line 16 and the neutral line 17 of each branch circuit. An inductor L3 is connected in the load line 16 between the two capacitors C9a and C9b. Preferably, the capacitors C9a and C9b have a rating across the line of about 0.47 uF. The inductor L3 has a rating for 15 amps at 500 uH and dimensions of about 1.5" diameter and 1.313" in length (e.g., Dale IHV 15-500). These values, of course, can be adjusted for the power rating of the electrical system and the load 26.

The capacitor C9a creates a low impedance path for any series arcing that occurs upstream of that capacitor, such as arcing within the wall upstream of a noisy load. This permits series arcing to be detected in the branch containing the blocking filter. The inductor L3 creates an impedance that does most of the attenuation of the signal created by a noisy load. This inductor is sized to carry the load current of the device, which is typically 15 or 20 amperes. The second capacitor C9b reduces the amount of inductance required in the inductor L3, by creating a low impedance path across the load 26.

One of the advantages of the blocking filter 42 is that it can be used locally on a particular branch circuit that is known to connect to a load 26 which is noisy. The expense of using the blocking filter 42 is reduced since it can be used only where needed. The blocking filter 42 also allows easy retrofitting to existing electrical distribution systems in residences and commercial space.

Turning now to FIG. 1b, the integrated protection system of FIG. 1a is shown in another embodiment using an isolation module 22 at the distribution panel. The isolation module 22 is designed to ensure that arcing fault signals are "isolated" to the branch circuit in which they occur. For example, the isolation device 22 shown in FIG. 1b ensures that arcing fault signals present on line conductor 16a do not cross over to line conductor 16b, and vice versa. A series of bus bar tabs T1 and T2 extend in alternating fashion along the length of distribution center 100. Each of the tabs T1 are electrically connected to line bus L1 and each of the tabs T2 are electrically connected to line bus L2. (The electrical connection between tabs T1, T2 and line buses L1, L2 is not visible in FIG. 1b.) The isolation module 22 is electrically connected to the neutral bus N through pig-tail wire 19. The isolation module 22 comprises a "two-pole" module, connected to one of the tab pairs T1, T2 (not visible in FIG. 1b), thus electrically connected to both line buses L1 and L2. It will be appreciated, however, that isolation may be provided by one or two "single-pole" isolation modules (not shown), each connected to one of the line buses L1 or L2 and the neutral bus N. In either case, it will further be appreciated that the isolation module(s) 22 may be connected to the line buses L1 and/or L2 by wire or other suitable means known in the art rather than as described above.

The electrical distribution system may also include individual isolation modules (not shown) for one or more of the individual branch circuits instead of the dual-pole isolation module 22 shown in FIG. 1b. However, if individual isolation modules are desired, they must be positioned on the power source side of an arcing fault detector in any given branch circuit. For example, if branch isolation modules are used in FIG. 1b, they must be positioned on the power source side of arcing fault detector modules 20a, 20b, 20c or 20d.

Figure 4A:
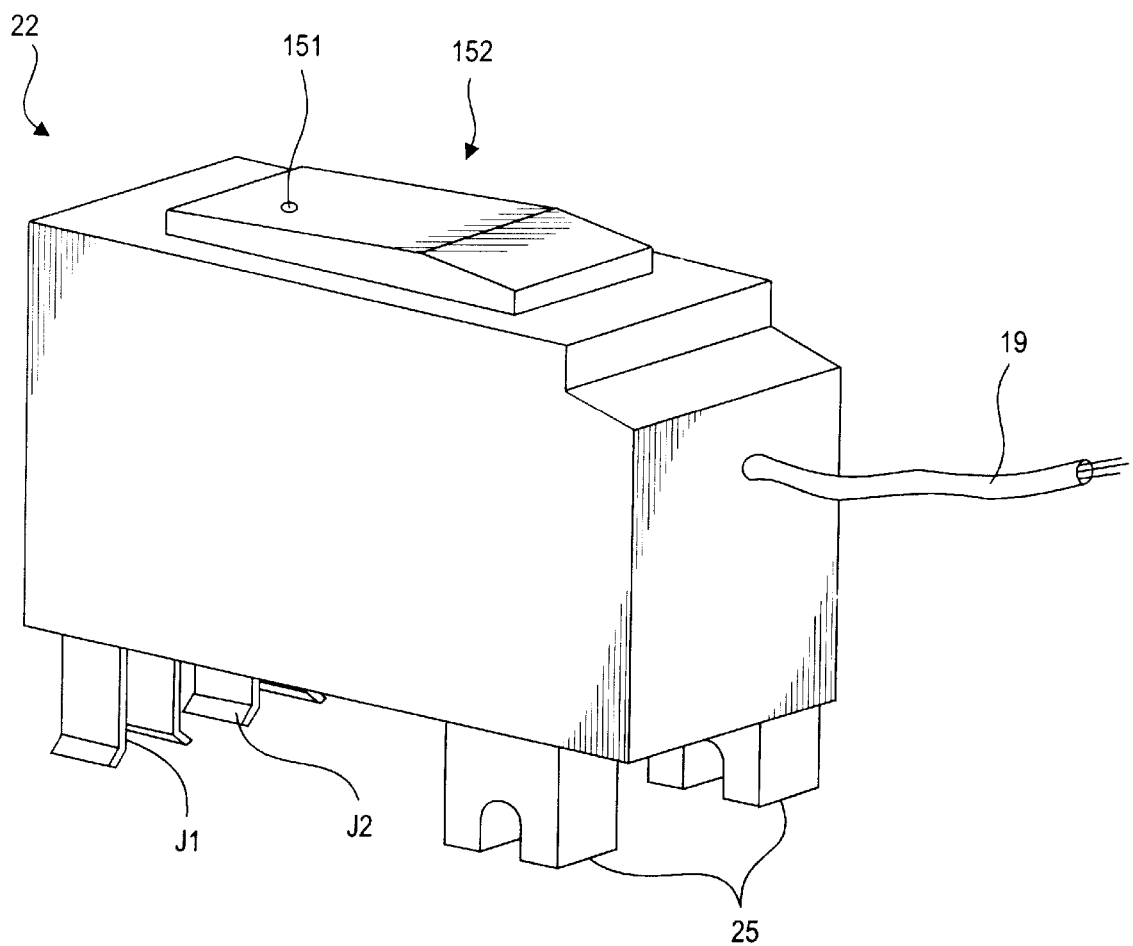
FIG. 4a is a perspective view of an isolation module which may be used in the integrated protection systems of FIGS. 1–3.

The exterior housing of the two-pole isolation module 22 is illustrated in more detail in FIG. 4a. Jaws J1 and J2 on one side of the isolation module 22 are each adapted to plug onto one of the bus bar tabs T1, T2 of the distribution panel and thus provide an electrical connection to respective line buses L1 and L2. For instance, jaw J1 may be electrically connected to line bus L1 through connection to bus bar tab T1 and jaw J2 may be electrically connected to line bus L2 through connection to bus bar tab T2. Rail clips 25 on another side of the isolation module 22 are adapted to plug onto a mounting rail in the panelboard to help retain the isolation module 22 firmly in position in the panelboard. Pig-tail wire 19 connects the device to the neutral bus N. As will be described below, a window 151 in a top wall 152 of the housing allows a user to see an LED inside the device.

Figure 4B:
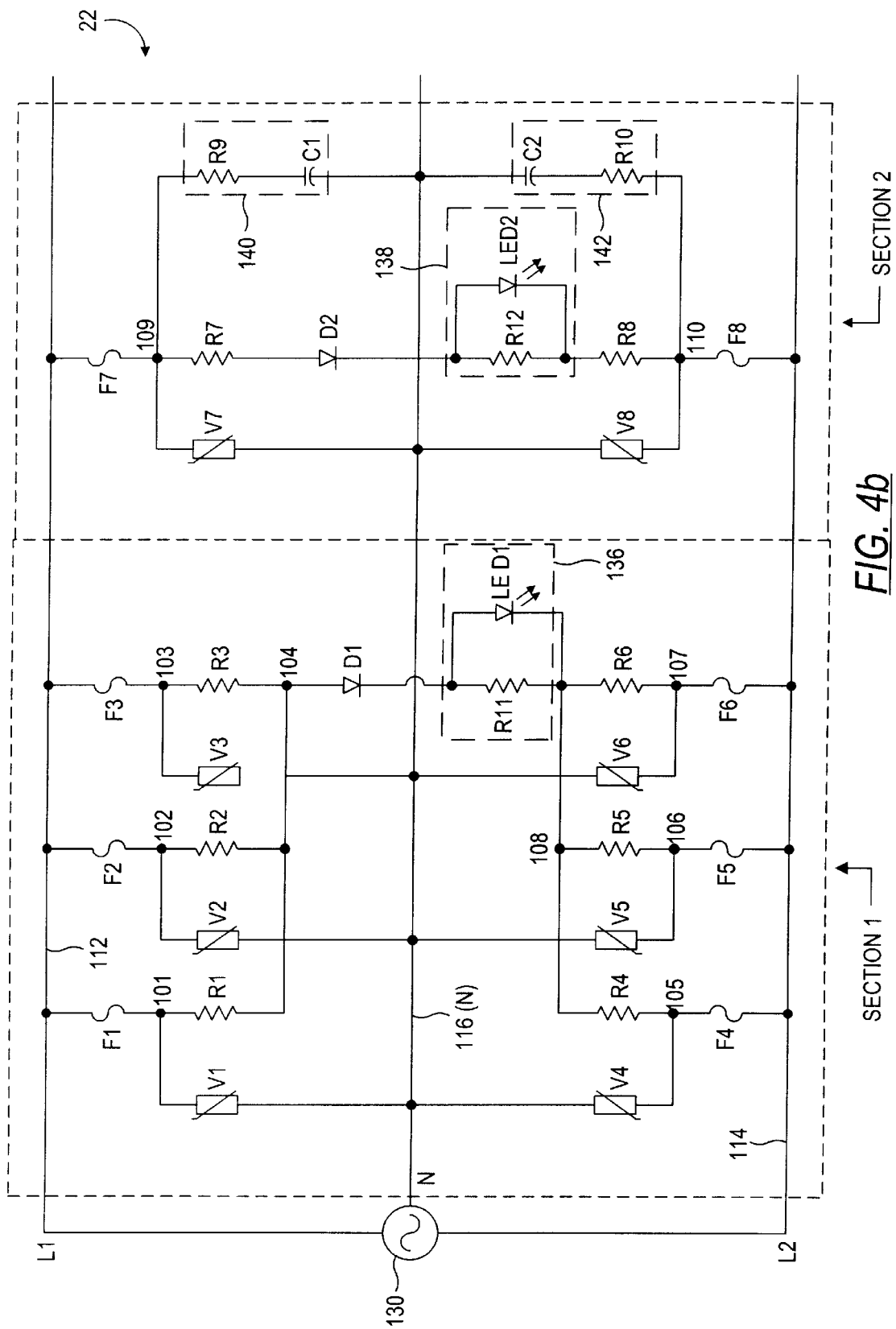

FIG. 4b depicts an electrical circuit for implementing the two-pole isolation module 22 described in relation to FIGS. 1b and 4a. As shown in FIG. 4b, the two-pole isolation module 22 is connected to supply source 130 via line buses L1 and L2 and neutral bus N. The isolation module 22 includes both surge protection circuitry (section 1) and isolation circuitry (section 2). However, it will be appreciated that module 22 may contain only isolation circuitry.

Referring initially to the surge protection circuitry (section 1) and, more specifically, to the portion of section 1 located between the line bus L1 and neutral bus N, there is provided a plurality of fuses F1, F2, F3 connected between the line bus L1 and nodes 101, 102, and 103 respectively. Varistors V1, V2, and V3 are connected between nodes 101, 102, and 103, respectively, and the neutral bus N. Preferably, the varistors are metal oxide varistors using zinc oxide. Resistors R1, R2, R3 are connected between nodes 101, 102, and 103, respectively, and node 104.

Fuses F1, F2, and F3 open if the respective varistors V1, V2, and V3 fail, that is if a destructive surge occurs. Resistors R1, R2, and R3 form a resistance ladder which develops a voltage across display resistor R11. Diode D1 provides a forward bias between node 104 and the first display 136.

Now referring to the remainder of the surge protection circuitry (section 1) located between the line bus L2 and the neutral bus N, there is provided a plurality of fuses F4, F5 and F6 connected between the line bus L2 and nodes 105, 106 and 107 respectively. Varistors V4, V5 and V6 are connected between nodes 105, 106 and 107, respectively, and the neutral bus N. Resistors R4, R5 and R6 are connected between node 105, 106 and 107 respectively and node 108. The fuses F4, F5 and F6 are designed to open if the respective varistors V4, V5 and V6 fail.

Display 136 comprises a resistor R11 connected in parallel with a light emitting diode LED1 visible through an opening 151 in a top wall 152 of isolation module 22 (shown in FIG. 4a). LED 1 provides for monitoring the status condition of varistor and fuse pairs such as V1 and F1. The intensity of LED1 decreases when a fuse is blown. When only a predetermined number of varistor and fuse pairs remain operational, LED1 will extinguish entirely to signal for replacement of the surge protection circuitry.

Specifically, the light output of LED1 varies with the operating condition of each varistor and fuse pair. Display 136 uses the first plurality of resistors R1, R2 and R3, the second plurality of resistors R4, R5 and R6, diode D1, resistor R1 and LED1 to indicate when the circuit is operating correctly. The resistance ladder of the first set of resistors R1–R3 monitors the fuses F1, F2 and F3 on line bus L1 and the second set of resistors R4–R6 monitors the fuses F4, F5 and F6 and the line bus L2. Line buses L1 and L2 each develop a voltage across resistor R11 that is proportional to the number of conducting fuses F1, F2, F3, F4, F5, F6. Only when a preselected number of these fuses are intact will sufficient voltage be available to forward bias LED1 to emit a signal to indicate that the surge protection circuitry is operational.

The above-described surge arrestor circuit is designed to limit the voltage between line bus L1 and neutral bus N upon the occurrence of a voltage surge. The operation of the surge arrestor circuit is described in detail in U.S. Pat. No. 5,412,526, hereby incorporated by reference.

Referring next to the isolation circuitry (section 2) of FIG. 4b and, more specifically, to the portion of section 2 located between the line bus L1 and neutral bus N, there is provided a fuse F7 connected between the line bus L1 and a node 109. A filter 140 consisting of a capacitor C1 in series with a resistor R9, is connected between the node 109 and the neutral bus N. Filter 140 is designed to effectively short high-frequency arcing fault signals from line bus L1 to neutral bus N, thus preventing arcing fault signals on line bus L1 from crossing over to line bus L2. In completing the arcing fault signal path from line bus L1 to neutral bus N, the filter 140 accomplishes two functions. First, it prevents an arcing fault detector (not shown) on line bus L2 from detecting a "false" arcing fault signal on line bus L2. Second, it increases the signal strength at an arcing fault detector (not shown) positioned on line bus L1 on a load side of filter 140. Varistor V7 is connected between the node 109 and the neutral bus N. Varistor V7 provides a degree of surge protection for the isolation circuitry connected between the line bus L1 and the neutral bus N. A resistor R7 and a diode D2 are connected in series between the node 109 and a display 138.

Referring now to the remainder of the isolation circuitry (section 2) located between line bus L2 and neutral bus N, there is provided a fuse F8 connected between the line bus L2 and a node 110. A filter 142 consisting of a capacitor C2 in series with a resistor R10 is connected between node 110 and the neutral bus N. Filter 142 is designed to complete the arcing fault signal path from line bus L2 to neutral bus N by effectively shorting high frequency arcing fault signals from the line bus L2 to neutral bus N. Thus, similar to the filter 140 described above, the filter 142 prevents an arcing fault detector (not shown) on line bus L1 from detecting a "false" arcing fault signal on line bus L1, and increases the signal strength at an arcing fault detector (not shown) positioned on line bus L2 on a load side of filter 142. A varistor V8 provides a degree of surge protection for the isolator circuitry connected between line bus L2 and neutral bus N. Resistor R8 is connected between node 110 and display 138.

Display 138 consists of a resistor R12 connected in parallel with an LED2. Display 138 provides a means for monitoring the operating status of the isolation circuitry. Should fuse F4 or F8 blow for any reason, causing a loss of isolator functionality, the LED2 will turn off. LED2 is visible through an opening 151 in the top wall 152 of the isolation module 22 (shown in FIG. 4a).

Figure 2A:
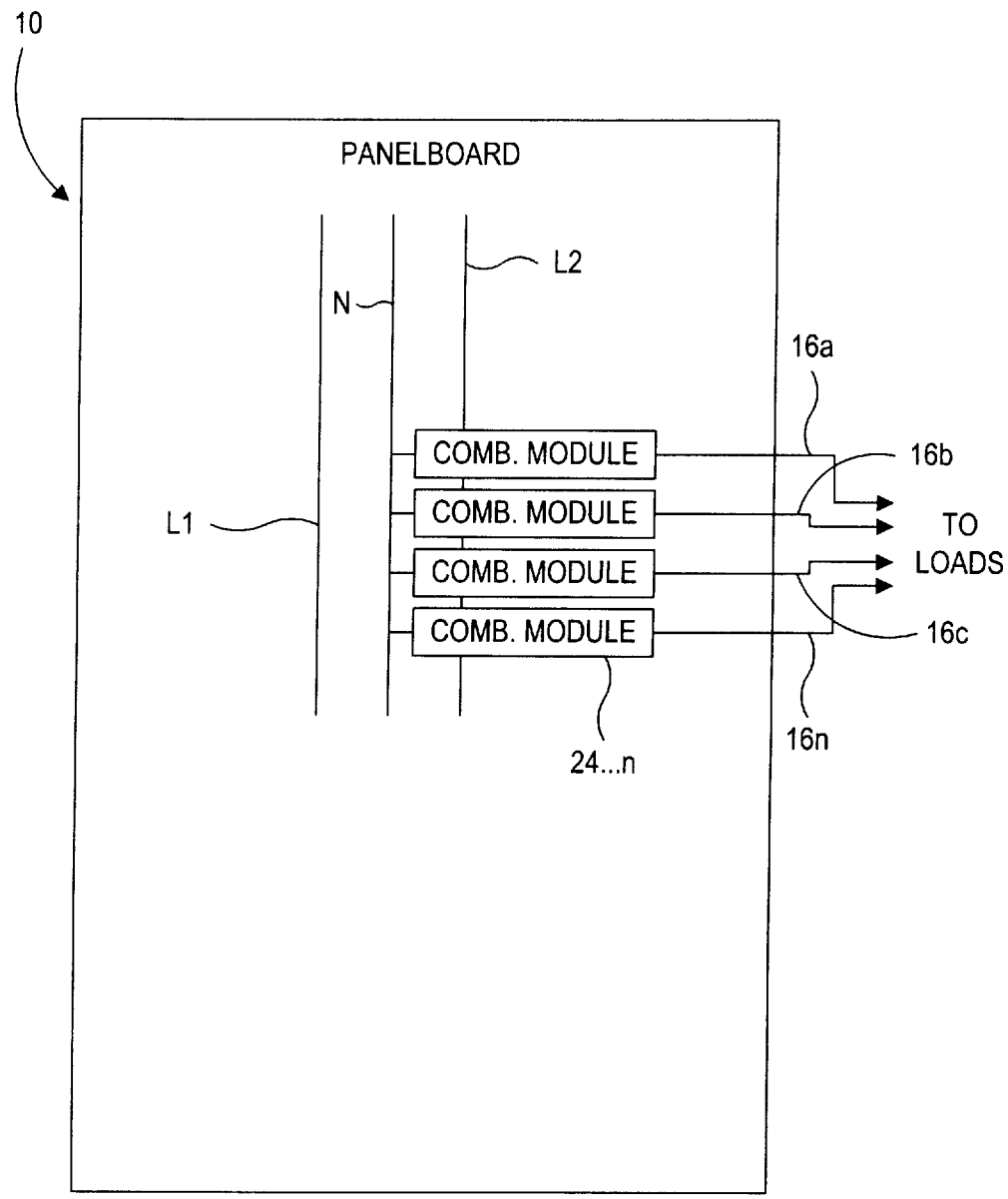
FIG. 2a is a block diagram of a panelboard including an integrated protection system according to another embodiment of the present invention.
Figure 2B:
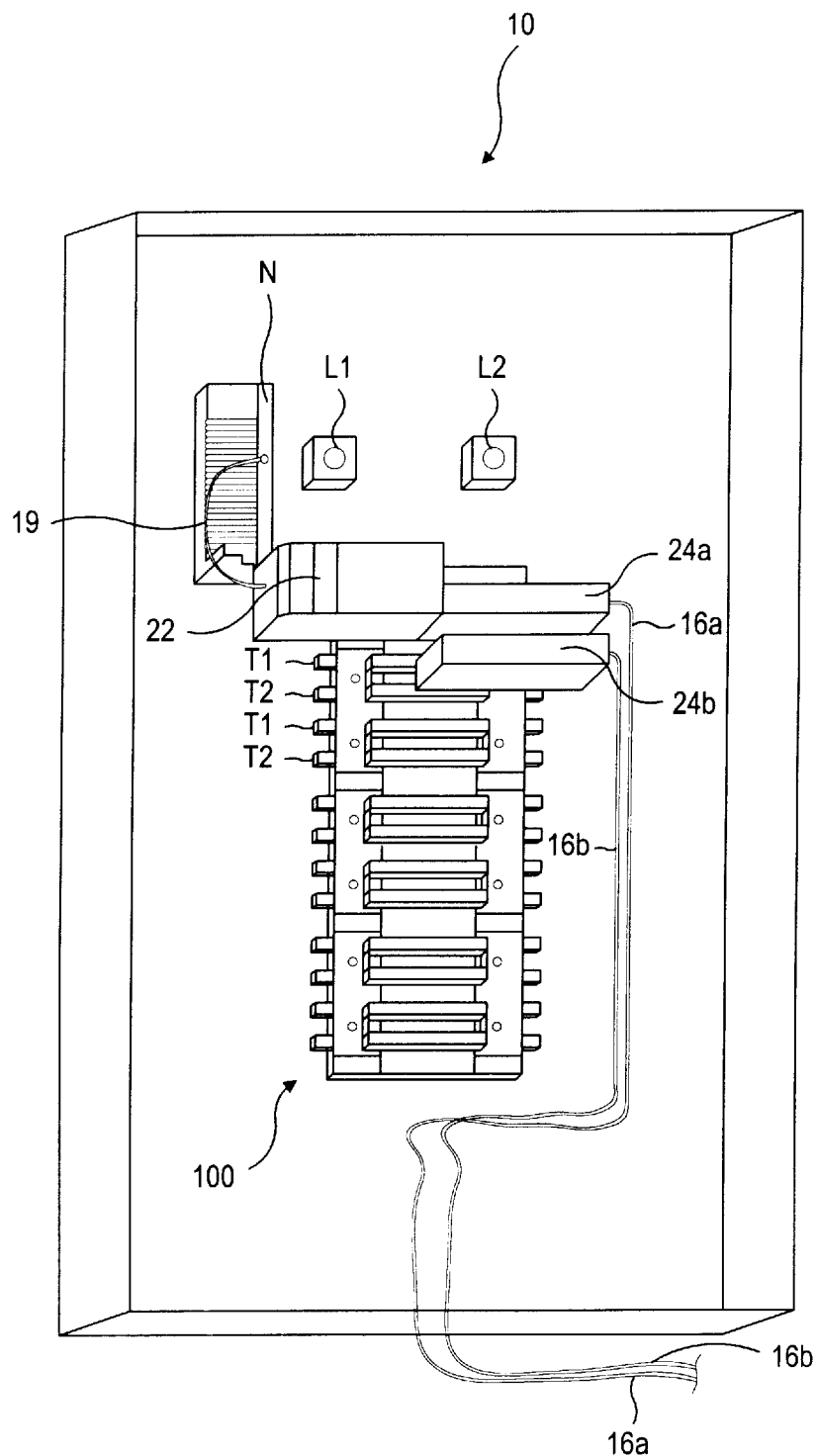
FIG. 2b is a perspective view of a panelboard including the integrated protection system of FIG. 2a with an isolation module at the distribution panel.

Referring now to FIG. 2a, there is depicted a panelboard 10 including an integrated protection system according to another embodiment of the present invention. In this embodiment, the arcing fault detection and line interrupting functions described above are accomplished by combination arcing fault detector and line interrupter modules 24a, 24b, 24c . . . 24n (hereinafter "combination modules"). Each of the combination modules is associated with one of the branch circuits of the electrical distribution system and includes both arcing fault detection circuitry and a line interrupter. The combination modules 24a, 24b, 24c . . . 24n may be plugged onto or bolted to one of the line buses L1 or L2 as shown in FIGS. 2a and 2b, or they may be mounted separately within the panelboard 10 and connected to the line buses L1 or L2 by wire. As shown in FIG. 2b, the integrated protection system may also include an isolation module 22 for electrically isolating arcing fault signals to the branch circuit on which they occurred, as described in relation to FIG. 1b. Branch isolation may also be achieved by isolation circuitry within the combination modules 24a, 24b, 24c . . . 24n. In either case, the isolation module 22 or combination modules 24a . . . n may also include surge protection circuitry to protect the line buses or either of the branch circuits from voltage surges.

Similarly to the line interrupters described in relation to FIGS. 1a and 1b, the combination module 24 shown in FIG. 2a or 2b may comprise a relay, fuse, automatic switch or circuit breaker combined with an arcing fault detector. In a preferred embodiment, the combination module 24 comprises a circuit breaker with arcing fault detection capability, such as the circuit breaker 18 shown in FIG. 10. In the embodiment shown in FIG. 10, arcing fault detection capability is provided by the sensing coil 21 and associated electronic components 92. It is preferred that the electronic components 92 detect arcing faults in the manner of the AFD module 20 described in relation to FIGS. 4–8. However, it will be appreciated that the electronic components 92 may vary in configuration or operate differently than those of the AFD module 20. Moreover, in embodiments in which the circuit breaker 18 has GFI capability, the electronic components 92 may reflect any configuration known in the art for sensing ground faults. At any rate, the electronic components 92 are designed 2 0 to produce an "AFD" signal (or "GFI" signal, if applicable) in response to detection of an arcing fault or ground fault. The AFD or GFI signal causes a magnetic field to be created around a trip solenoid 95, causing a plunger 97 to be drawn to the right. The plunger 97 is connected to a trip link 99, which in turn is connected to the armature 74, such that movement of the plunger 97 causes the armature 74 to be drawn to the right. Movement of the armature 74 to the right causes the trip lever 76 to be released and the current path through the circuit breaker 18 to be interrupted.

Figure 3A:
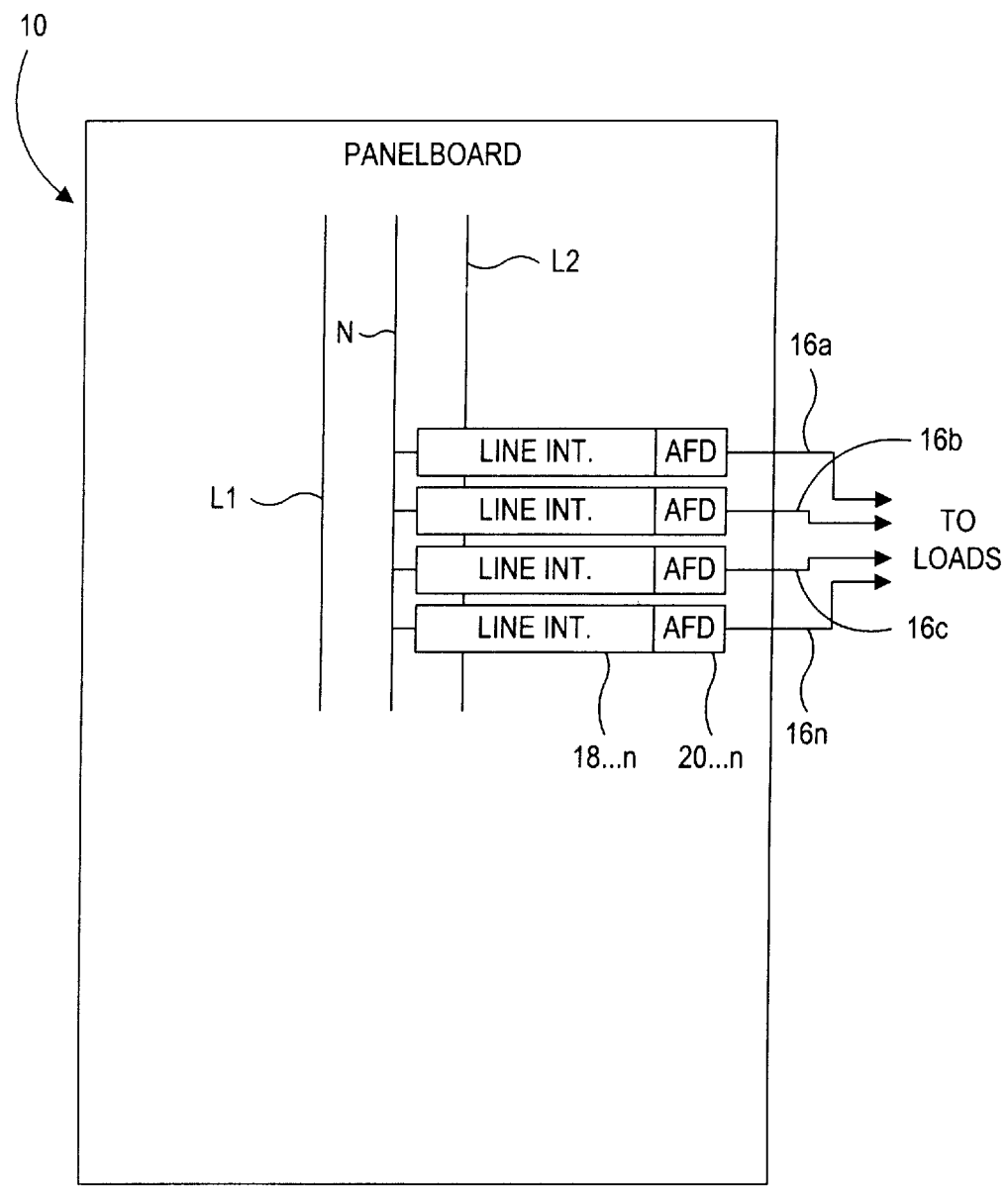
FIG. 3a is a block diagram of a panelboard including an integrated protection system according to still another embodiment of the present invention.
Figure 3B:
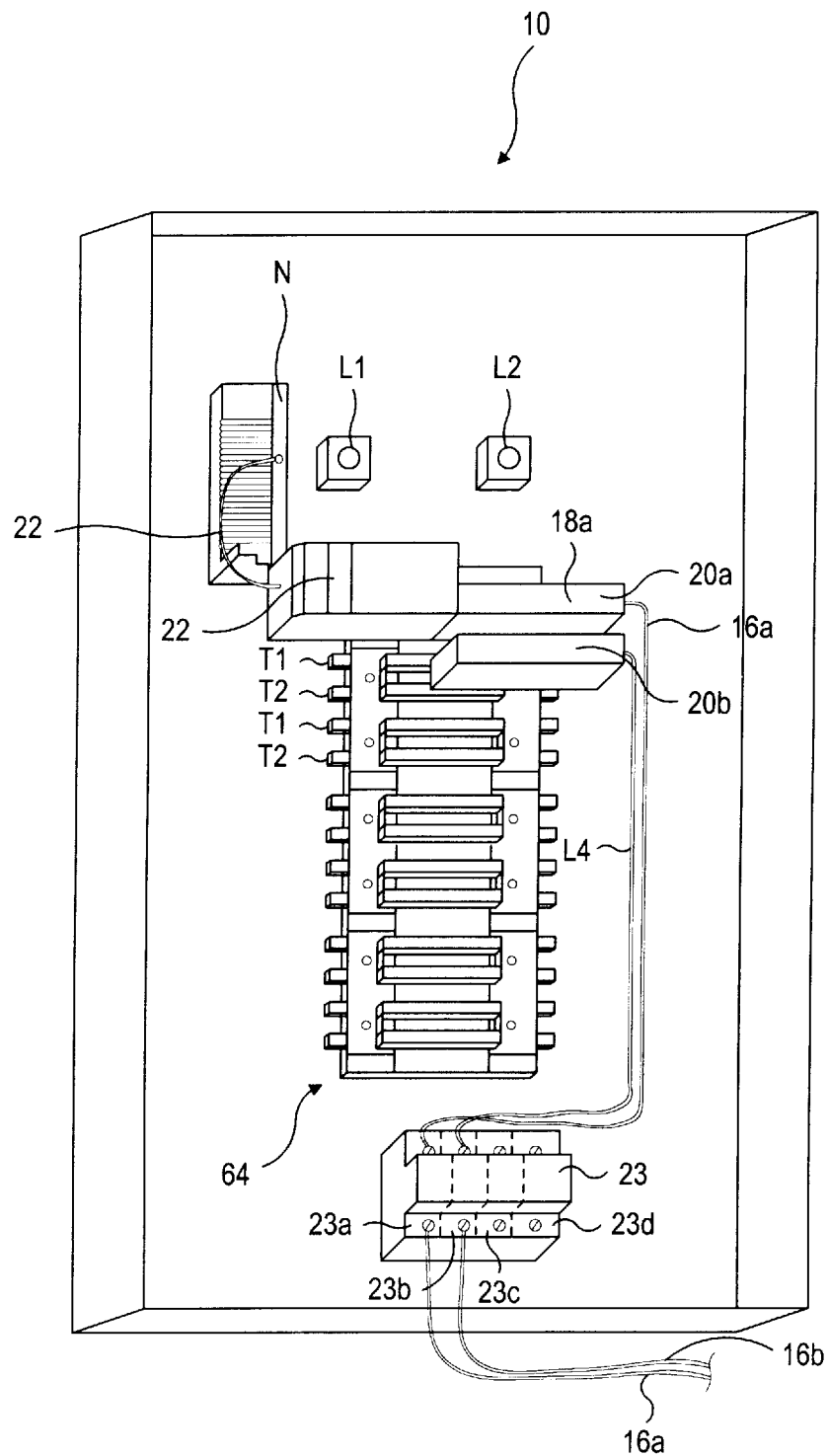
FIG. 3b is a perspective view of a panelboard including the integrated protection system of FIG. 3a with an isolation module at the distribution panel.

Now referring to FIGS. 3a and 3b, there is depicted a panelboard 10 including an integrated protection system according to still another embodiment of the present invention. In this embodiment, the arcing fault detection and line interrupting functions described above are accomplished by separate arcing fault detector modules 20a, 20b, 20c . . . 20n and line interrupter modules 18a, 18b, 18c . . . 18n substantially as described in relation to FIGS. 1a and 1b. However, in this embodiment, the arcing fault detector modules 20a, 20b, 20c . . . 20n are attached externally to the line interrupter modules 18a, 18b, 18c . . . 18n rather than being mounted to one of the positions in the panelboard 10. The line interrupter modules 18a, 18b, 18c . . . 18n may be plugged onto or bolted to one of the line buses L1 or L2 as shown in FIGS. 1a and 1b, or they may be mounted separately within the panelboard 10 and connected to one of the line buses L1 or L2 by wire. The integrated protection system may also include isolation module(s) 22 and/or branch isolation means substantially as described in relation to FIG. 1b. In either case, the isolation module(s) 22 or branch isolation means may include surge protection circuitry to protect the line buses or either of the branch circuits from voltage surges.

While particular embodiments and applications of the present invention have been illustrated and described, it is to be understood that the invention is not limited to the precise construction and compositions disclosed herein and that various modifications, changes, and variations will be apparent from the foregoing descriptions without departing from the spirit and scope of the invention as defined in the appended claims.

What is claimed is:

1. An integrated protection system for an electrical distribution system including a panelboard for receiving and distributing power from a utility source, said panelboard receiving said power through at least one line bus and a neutral bus, said panelboard distributing said power from said at least one line bus and said neutral bus to a plurality of branch circuits each having line and neutral conductors for delivering said power to a load, each of said line conductors being electrically connected to one of said at least one line buses, each of said neutral conductors being electrically connected to said neutral bus, said panelboard including a framework having a plurality of positions for attaching circuit protection devices to a selected number of branch circuits, said integrated protection system comprising:

multiple arcing fault detectors mounted within the panelboard enclosure with each detector coupled to a different branch circuit for detecting the occurrence of an arcing fault in that branch circuit; each arcing fault detector sensing the rate of change of the current or voltage in the line conductor of the branch circuit associated with that detector, and at least one line interrupter attached to a corresponding at least one of the positions in said framework for disconnecting the load from the power source in any of the selected branch circuits in which an arcing fault has been detected.

2. The integrated protection system of claim 1 wherein each of said at least one line interrupters is electrically connected between one of said line buses and a line conductor of one of the selected branch circuits, each of said at least one arcing fault detector modules being positioned on the line conductor of a respective one of the selected branch circuits.

3. The integrated protection system of claim 2 wherein each of said at least one line interrupters comprises a circuit breaker.

4. The integrated protection system of claim 3 wherein each of said at least one arcing fault detector modules includes a circuit interrupter adapted to interrupt electrical current in response to arcing faults in a respective one of said selected branch circuits.

5. An integrated protection system for an electrical distribution system including a panelboard for receiving and distributing power from a utility source, said panelboard receiving said power through at least one line bus and a neutral bus, said panelboard distributing said power from said at least one line bus and said neutral bus to a plurality of branch circuits each having line and neutral conductors for delivering said power to a load, each of said line conductors being electrically connected to one of said at least one line buses, each of said neutral conductors being electrically connected to said neutral bus, said panelboard including a framework having a plurality of positions for attaching circuit protection devices to a corresponding plurality of branch circuits, said integrated protection system comprising:

at least one arcing fault detector module attached to a corresponding at least one of the positions in said framework for detecting the occurrence of arcing faults in a selected number of branch circuits, at least one line interrupter attached to a corresponding at least one of the positions in said framework for disconnecting the load from the power source in any of the selected branch circuits in which an arcing fault has been detected, and an isolation module electrically connected to said at least one line bus and a neutral bus on a power source side of said arcing fault detection module, said isolation module being adapted to electrically isolate arcing fault signals to the branch circuit in which they occurred.

6. The integrated protection system of claim 5 wherein said isolation module includes surge protection circuitry for protecting said electrical distribution system from voltage surges.

7. An integrated protection system for an electrical distribution system including a panelboard for receiving and distributing power from a utility source, said panelboard receiving said power through at least one line bus and a neutral bus, said panelboard distributing said power from said at least one line bus and said neutral bus to a plurality of branch circuits each having line and neutral conductors for delivering said power to a load, each of said line conductors being electrically connected to one of said at least one line buses, each of said neutral conductors being electrically connected to said neutral bus, said panelboard including a framework having a plurality of positions for attaching circuit protection devices to a corresponding plurality of branch circuits, said integrated protection system comprising:

at least one arcing fault detector module attached to a corresponding at least one of the positions in said framework for detecting the occurrence of arcing faults in a selected number of branch circuits;

at least one line interrupter attached to a corresponding at least one of the positions in said framework for disconnecting the load from the power source in any of the selected branch circuits in which an arcing fault has been detected; and an isolation module attached to one of the positions in said framework for electrically isolating arcing fault signals to the branch circuit in which they occur.

8. The integrated protection system of claim 7 wherein said isolation module is electrically connected to each of said at least one line bus and said neutral bus, each of said at least one line interrupters being electrically connected between one of said at least one line buses and a line conductor of one of the selected branch circuits, each of said at least one arcing fault detector modules being positioned on the line conductor of a respective one of the selected branch circuits.

9. The integrated protection system of claim 8 wherein said isolation module includes surge protection circuitry for protecting each of said at least one line buses from voltage surges.

10. The integrated protection system of claim 7 wherein each of said at least one line interrupters comprises a circuit breaker.

11. The integrated protection system of claim 7 wherein each of said at least one arcing fault detector modules includes a circuit interrupter adapted to interrupt electrical current in a respective one of said selected branch circuits.

12. An integrated protection system for an electrical distribution system including a panelboard for receiving and distributing power from a utility source, said panelboard receiving said power through at least one line bus and a neutral bus, said panelboard distributing said power from said at least one line bus and said neutral bus to a plurality of branch circuits each having line and neutral conductors for delivering said power to a load, each of said line conductors being electrically connected to one of said at least one line buses, each of said neutral conductors being electrically connected to said neutral bus, said panelboard including a framework having a plurality of positions for attaching circuit protection devices to a corresponding plurality of branch circuits, said integrated protection system comprising:

multiple combination arcing fault detector and line interrupter modules mounted within the panelboard enclosure with each module coupled to a different branch circuit for detecting the occurrence of an arcing fault in that branch circuit and disconnecting the load in that branch circuit from the power source, each arcing fault detector sensing the rate of change of the current or voltage in the line conductor of the branch circuit associated with that detector.

13. The integrated protection system of claim 12 wherein each of said at least one combination arcing fault detector and line interrupter modules is electrically connected between one of said line buses and a line conductor of one of the selected branch circuits.

14. An integrated protection system for an electrical distribution system including a panelboard for receiving and distributing power from a utility source, said panelboard receiving said power through at least one line bus and a neutral bus, said panelboard distributing said power from said at least one line bus and said neutral bus to a plurality of branch circuits each having line and neutral conductors for delivering said power to a load, each of said line conductors being electrically connected to one of said at least one line buses, each of said neutral conductors being electrically connected to said neutral bus, said panelboard including a framework having a plurality of positions for attaching circuit protection devices to a corresponding plurality of branch circuits, said integrated protection system comprising:

at least one combination arcing fault detector and line interrupter module attached to a corresponding at least one of the positions in said framework for detecting the occurrence of arcing faults and disconnecting the load from the power source in a selected number of branch circuits, and an isolation module attached to one of the positions in said framework for electrically isolating arcing fault signals to the branch circuit in which they occur.

15. The integrated protection system of claim 14 wherein said isolation module is electrically connected to each of said at least one line bus and said neutral bus, each of said at least one combination arcing fault detector and line interrupter modules being electrically connected between one of said at least one line buses and a line conductor of one of the selected branch circuits.

16. The integrated protection system of claim 15 wherein said isolation module includes surge protection circuitry for protecting each of said at least one line buses from voltage surges.

17. An integrated protection system for an electrical distribution system including a panelboard for receiving and distributing power from a utility source, said panelboard receiving said power through at least one line bus and a neutral bus, said panelboard distributing said power from said at least one line bus and said neutral bus to a plurality of branch circuits each having line and neutral conductors for delivering said power to a load, each of said line conductors being electrically connected to one of said at least one line buses, each of said neutral conductors being electrically connected to said neutral bus, said panelboard including a framework having a plurality of positions for attaching circuit protection devices to a corresponding plurality of branch circuits, said integrated protection system comprising:

at least one line interrupter module attached to a corresponding at least one of the positions in said framework for disconnecting the load from the power source in any of a selected number of branch circuits in response to receiving a trip signal; and multiple arcing fault detectors mounted within the panelboard enclosure and attached to one of said line interrupter modules with each detector coupled to a different branch circuit for detecting the occurrence of an arcing fault in that branch circuit; each arcing fault detector sensing the rate of change of the current or voltage in the line conductor of the branch circuit associated with that detector.

18. The integrated protection system of claim 17 wherein each of said at least one line interrupter modules is electrically connected between one of said line buses and a line conductor of one of the selected branch circuits.

19. The integrated protection system of claim 17 wherein each of said at least one line interrupter modules comprises a circuit breaker.

20. An integrated protection system for an electrical distribution system including a panelboard for receiving and distributing power from a utility source, said panelboard receiving said power through at least one line bus and a neutral bus, said panelboard distributing said power from said at least one line bus and said neutral bus to a plurality of branch circuits each having line and neutral conductors for delivering said power to a load, each of said line conductors being electrically connected to one of said at least one line buses, each of said neutral conductors being electrically connected to said neutral bus, said panelboard including a framework having a plurality of positions for attaching circuit protection devices to a corresponding plurality of branch circuits, said integrated protection system comprising:

at least one line interrupter module attached to a corresponding at least one of the positions in said framework for disconnecting the load from the power source in any of a selected number of branch circuits in response to receiving a trip signal; and at least one arcing fault detector module attached to a corresponding at least one of said line interrupter modules for detecting the occurrence of arcing faults and generating said trip signal in said selected number of branch circuits, and an isolation module attached to one of the positions in said framework for electrically isolating arcing fault signals to the branch circuit on which they occur.

21. The integrated protection system of claim 20 wherein said isolation module is electrically connected to each of said at least one line bus and said neutral bus, each of said at least one line interrupter modules being electrically connected between one of said at least one line buses and a line conductor of one of the selected branch circuits.

22. The integrated protection system of claim 20 wherein said isolation module includes surge protection circuitry for protecting each of said at least one line buses from voltage surges.

23. An integrated protection system for an electrical distribution system including a panelboard for receiving and distributing power from a utility source, said panelboard receiving said power through at least one line bus and a neutral bus, said panelboard distributing said power from said at least one line bus and said neutral bus to a plurality of branch circuits each having line and neutral conductors for delivering said power to a load, each of said line conductors being electrically connected to one of said at least one line buses, each of said neutral conductors being electrically connected to said neutral bus, said panelboard including a framework having a plurality of positions for attaching circuit protection devices to a selected number of branch circuits, said integrated protection system comprising:

multiple arcing fault detectors mounted within the panelboard enclosure with each detector coupled to a different branch circuit for detecting the occurrence of an arcing fault in that branch circuit, each arcing fault detector including a sensor coupled to said line conductor and producing a sensor output signal, and signal processing circuitry responsive to said sensor output signal for detecting the occurrence of an arcing fault in a branch circuit and producing a control signal in response to such an occurrence, and at least one line interrupter responsive to said control signal and attached to said framework for disconnecting the load from the power source in any of the branch circuits in which an arcing fault has been detected.

24. An integrated protection system for an electrical distribution system including a panelboard for receiving and distributing power from a utility source, said panelboard receiving said power through at least one line bus and a neutral bus, said panelboard distributing said power from said at least one line bus and said neutral bus to a plurality of branch circuits each having line and neutral conductors for delivering said power to a load, each of said line conductors being electrically connected to one of said at least one line buses, each of said neutral conductors being electrically connected to said neutral bus, said panelboard including a framework having a plurality of positions for attaching circuit protection devices to a selected number of branch circuits, said integrated protection system comprising:

multiple arcing fault detectors mounted within the panelboard enclosure with each detector coupled to a different branch circuit for detecting the occurrence of an arcing fault in that branch circuit and producing an arcing fault detection signal; and a separate and normally closed line interrupter in series with each branch circuit and attached to one of the positions in said framework and responsive to said arcing fault detection signal for disconnecting the load from a branch circuit in which an arcing fault has been detected.

25. An integrated protection system for an electrical distribution system including a panelboard for receiving and distributing power from a utility source, said panelboard receiving said power through at least one line bus and a neutral bus, said panelboard distributing said power from said at least one line bus and said neutral bus to a plurality of branch circuits each having line and neutral conductors for delivering said power to a load, each of said line conductors being electrically connected to one of said at least one line buses, each of said neutral conductors being electrically connected to said neutral bus, said panelboard including a framework having a plurality of positions for attaching circuit protection devices to a selected number of branch circuits, said integrated protection system comprising:

multiple arcing fault detectors mounted within the panelboard enclosure with each detector coupled to a different branch circuit for detecting the occurrence of an arcing fault in that branch circuit, each arcing fault detector sensing signals at frequencies substantially above the frequency of the power signal in the line conductor of the branch circuit associated with that detector; and at least one line interrupter attached to a corresponding at least one of the positions in said framework for disconnecting the load from the power source in any of the selected branch circuits in which an arcing fault has been detected.

\* \* \* \* \*